United States Patent
Park et al.

(10) Patent No.: US 10,008,659 B2
(45) Date of Patent: Jun. 26, 2018

(54) FINGERPRINT SENSOR

(71) Applicant: LG INNOTEK CO., LTD., Seoul (KR)

(72) Inventors: Jae Wan Park, Seoul (KR); Jung Hwan Bang, Seoul (KR); Sin Ae Jang, Seoul (KR); Jong Seon Jeong, Seoul (KR); Dong Keun Lee, Seoul (KR); Kyoung Jong Yoo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 399 days.

(21) Appl. No.: 14/814,969

(22) Filed: Jul. 31, 2015

(65) Prior Publication Data

US 2016/0163958 A1 Jun. 9, 2016

(30) Foreign Application Priority Data

Dec. 9, 2014 (KR) .................. 10-2014-0176121
Dec. 12, 2014 (KR) .................. 10-2014-0179089
Jan. 7, 2015 (KR) .................. 10-2015-0002149
Jan. 21, 2015 (KR) .................. 10-2015-0009926

(51) Int. Cl.
*H01L 41/113* (2006.01)
*G06K 9/00* (2006.01)
*H01L 41/047* (2006.01)

(52) U.S. Cl.
CPC ...... *H01L 41/1132* (2013.01); *G06K 9/00013* (2013.01); *H01L 41/047* (2013.01); *H01L 41/0477* (2013.01)

(58) Field of Classification Search
CPC ............ H01L 41/1132; H01L 41/047; H01L 41/0477; G06K 9/00013
USPC ........................................... 310/338
See application file for complete search history.

(56) References Cited

U.S. PATENT DOCUMENTS

| | | | |
|---|---|---|---|
| 6,050,144 A * | 4/2000 | Otsuchi | G01P 21/00 73/1.38 |
| 8,139,827 B2 * | 3/2012 | Schneider | G01N 29/06 382/123 |
| 9,453,822 B2 * | 9/2016 | Schneider | A61B 5/1172 |
| 2002/0053857 A1 | 5/2002 | Scott et al. | |
| 2002/0191820 A1 | 12/2002 | Kim et al. | |
| 2016/0107194 A1 * | 4/2016 | Panchawagh | G01S 15/8915 367/140 |
| 2016/0117541 A1 * | 4/2016 | Lu | G06K 9/0002 382/124 |
| 2016/0149116 A1 * | 5/2016 | Wang | H01L 41/1132 310/316.01 |

FOREIGN PATENT DOCUMENTS

| | | | |
|---|---|---|---|
| KR | 10-2002-0086971 A | 11/2002 | |
| KR | 20020086971 A * | 11/2002 | ......... G01B 7/28 |
| KR | 10-2008-0030672 A | 4/2008 | |
| KR | 10-2013-0066152 A | 6/2013 | |

* cited by examiner

*Primary Examiner* — Thomas Dougherty
(74) *Attorney, Agent, or Firm* — LRK Patent Law Firm

(57) ABSTRACT

A fingerprint sensor includes a substrate, a first electrode on the substrate, a piezoelectric layer on the first electrode, and a second electrode on the piezoelectric layer.

24 Claims, 30 Drawing Sheets

FINGERPRINT SENSOR

BACKGROUND OF THE INVENTION

1. Field of the Invention

The embodiment relates to a fingerprint sensor.

2. Description of Related Art

Recently, a fingerprint sensor, which detects the fingerprint of a person, has been extensively used even to determine the on/off of power and the release of a sleep mode in an electronic device, as well as a door lock, to which the fingerprint sensor has been conventionally widely applied.

Fingerprint sensors may be classified into an ultrasonic fingerprint sensor, an infrared fingerprint sensor, and a capacitive fingerprint sensor according to the operating principles thereof. For example, the ultrasonic fingerprint sensor employs a scheme of detecting a fingerprint by measuring the differences between acoustic impedances of valleys and ridges measured using relevant piezoelectric sensors, which are sources of ultrasonic waves, when ultrasonic signals having predetermined frequencies emitted from the piezoelectric sensors are reflected from the valleys and the ridges of the fingerprint. In particular, according to the advantages of the ultrasonic fingerprint sensor, in addition to a function of simply recognizing a fingerprint, the flow of blood in a finger can be detected by detecting a Doppler effect of reflected waves of the ultrasonic waves generated in the form of a pulse. Accordingly, even a fake fingerprint can be determined using the flow of the blood in the finger.

In the fingerprint sensor, a piezoelectric sensor is provided on a substrate, and electrodes are provided on both surfaces of the piezoelectric sensor to recognize the fingerprint as the ultrasonic waves are generated. However, when the piezoelectric sensor is directly provided on the substrate, the vibration of the piezoelectric sensor is restricted due to the bond between the piezoelectric sensor and the substrate. Accordingly, the characteristic of transmitting or receiving the ultrasonic wave may be degraded.

In addition, a resonance frequency band characteristic, and an ultrasonic wave generation characteristic are changed according to the characteristics of a piezoelectric sensor material. Accordingly, the resonance frequency band characteristic and the ultrasonic wave generation characteristic may be changed according to materials selected for the piezoelectric sensor.

In addition, when the piezoelectric material is provided, the haze value of the piezoelectric material is increased, so that the piezoelectric sensor may be viewed from the outside.

Further, the ultrasonic wave generated from the piezoelectric sensor toward the cover substrate may be more smoothly transmitted as the difference between the acoustic impedances of the piezoelectric sensor and the cover substrate is reduced. To this end, a buffer layer can be provided to reduce the difference between the acoustic impedances of the piezoelectric sensor and the cover substrate.

In this case, when the buffer layer is provided in a multi layer structure instead of a single layer structure, the process efficiency may be degraded, and the thickness of the buffer layer may be increased.

Accordingly, there is required a fingerprint sensor having a novel structure capable of solving the above problems.

SUMMARY

The embodiment provides a fingerprint sensor having improved reliability and efficiency, and having thin thickness.

According to the embodiment, there is provided a fingerprint sensor including a substrate, a first electrode on the substrate, a piezoelectric layer on the first electrode, and a second electrode on the piezoelectric layer.

As described above, the fingerprint sensor according to the embodiment can include a support member interposed between the substrate and the piezoelectric layer.

In other words, the support member can be interposed between the substrate and the piezoelectric layer to serve as a buffer between the piezoelectric layer and the substrate. In other words, when an object, such as a finger, makes contact with or touches the piezoelectric layer, the piezoelectric layer can be prevented from directly making contact with the substrate by the support member on the substrate.

Accordingly, when the object makes contact with or touches the piezoelectric layer, since the piezoelectric layer does not directly make contact with the substrate, the vibration generated from the piezoelectric layer can be prevented from interfering with the substrate. Accordingly, the sensing characteristic of the fingerprint sensor can be improved.

In addition, the fingerprint sensor according to the embodiment can include at least two layers including piezoelectric materials. In detail, the fingerprint sensor according to the embodiment can include the piezoelectric layer including the first and second piezoelectric layers, and the first and second piezoelectric layers may include mutually different piezoelectric materials.

Therefore, since the fingerprint sensor according to the embodiment can have both intrinsic characteristics of the mutually different piezoelectric materials, improved fingerprint recognition characteristics can be provided.

In addition, the fingerprint sensor according to the embodiment can include the intermediate layer including a plurality of protrusion parts. Accordingly, the ultrasonic signal transmitted in the direction from the piezoelectric layer to the cover substrate or received in the direction from the cover substrate to the piezoelectric layer can be smoothly moved.

The acoustic impedance can be defined with a density and the speed of the ultrasonic wave in a material. In other words, the intermediate layer interposed between the piezoelectric layer and the cover substrate can reduce the difference between the acoustic impedances of the piezoelectric layer and the cover substrate, so that the ultrasonic signal transmitted in the direction from the piezoelectric layer to the cover substrate or received in the direction from the cover substrate to the piezoelectric layer can be smoothly moved.

In addition, a protrusion pattern is formed on at least one of one surface and an opposite surface of the intermediate layer, so that the acoustic impedance may be gradually changed due to the protrusion part when the ultrasonic signal having the wavelength longer than that of the protrusion pattern passes through the intermediate layer.

Accordingly, even if the intermediate layer has a single layer structure, as the intermediate layer changes the acoustic impedances of the piezoelectric layer and the cover substrate stepwise, the transmitted or received ultrasonic signal can be smoothly moved. Therefore, the fingerprint sensor can be realized with a thin thickness, and the efficiency of the fingerprint sensor can be improved.

In other words, the fingerprint sensor according to the embodiment can include a piezoelectric layer having a low haze value, so that the visibility can be improved.

In detail, when the fingerprint sensor is provided in a display area in which an image is displayed, and when the piezoelectric layer having a high haze value is provided, the piezoelectric layer is viewed from the outside, so that the visibility may be degraded.

On the contrary, according to the fingerprint sensor of the embodiment, the piezoelectric layer having improved transparency can be realized by reducing the haze value. Accordingly, even when the fingerprint sensor is provided at the display area in which the image is displayed, the piezoelectric layer can be prevented from being viewed from the outside, so that visibility can be improved.

DETAILED DESCRIPTION OF THE EMBODIMENTS

Figure 1:
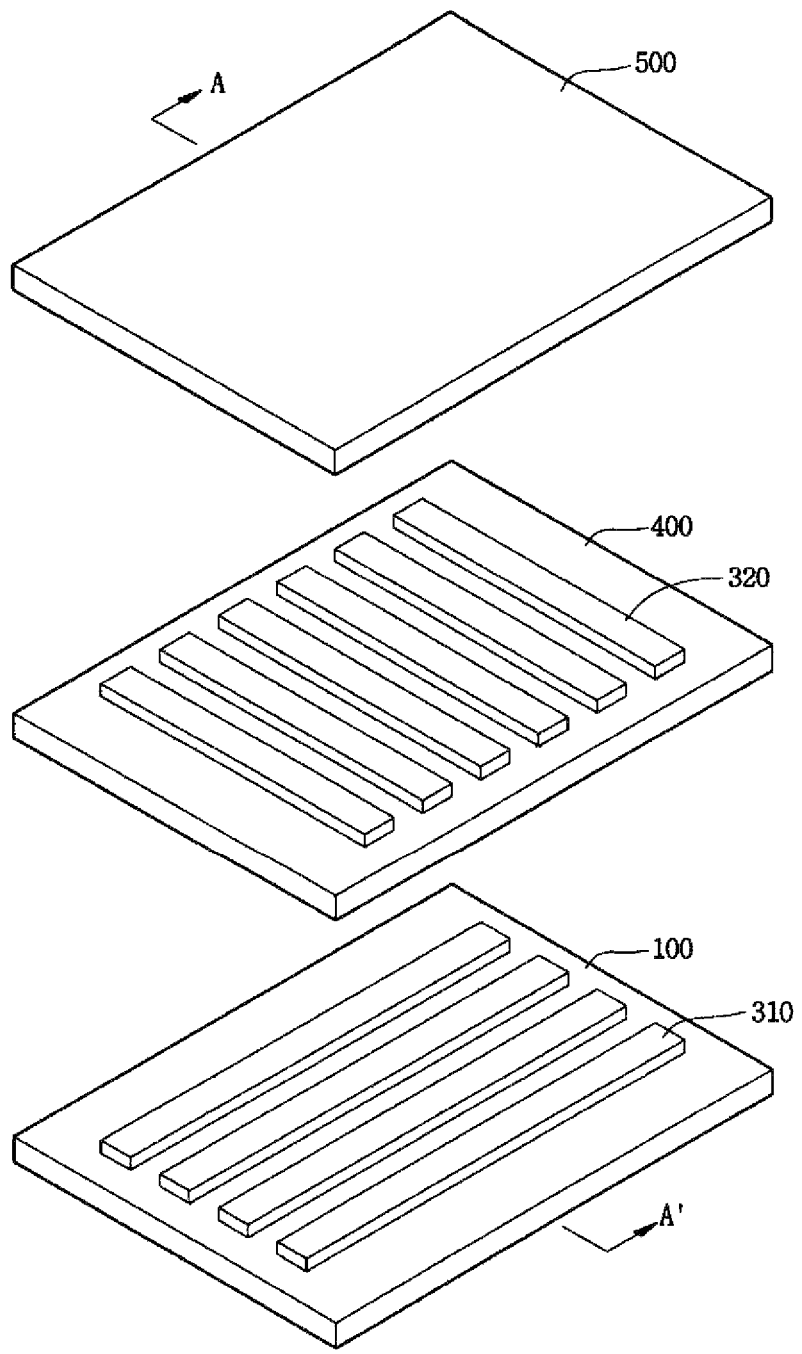
FIG. 1 is a perspective view showing a fingerprint sensor according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

It will be understood that when an element is referred to as being "connected" with another element, it can be directly connected with the other element or intervening elements may be present. In the following description, when a predetermined part "includes" a predetermined component, the predetermined part does not exclude other components, but may further include other components unless otherwise indicated.

The thickness and size of each layer (film), region, pattern, or structure shown in the drawings may be exaggerated, omitted or schematically drawn for the purpose of convenience or clarity. In addition, the size of the layer (film), region, pattern, or structure does not utterly reflect an actual size.

Hereinafter, a fingerprint sensor according to the embodiment will be described with reference to accompanying drawings.

Hereinafter, a fingerprint sensor according to the first embodiment will be described with reference to FIGS. 1 to 7.

Referring to FIGS. 1 to 7, a fingerprint sensor according to the first embodiment may include a substrate 100, a support member 200, a first electrode 310, a second electrode 320, and a piezoelectric layer 400.

The substrate 100 may be rigid or flexible. For example, the substrate 100 may include glass or plastic. In detail, the substrate 100 may include chemically tempered/semi-tempered glass, such as soda lime glass or aluminosilicate glass, reinforced/flexible plastic, such as polyimide (PI), polyethylene terephthalate (PET), propylene glycol (PPG), or poly carbonate (PC), or sapphire.

In addition, the substrate 100 may include an optically isotropic film. For example, the substrate 100 may include cyclic olefin copolymer (COC), cyclic olefin polymer (COP), optically isotropic polycarbonate (PC), or optically isotropic polymethyl methacrylate (PMMA).

The sapphire has superior electric characteristics, such as permittivity, so that a touch response speed may be greatly increased and a space touch such as hovering may be easily implemented. In addition, since the sapphire has high surface hardness, the sapphire is applicable to a cover substrate. The hovering refers to a technique of recognizing coordinates even at a slight distance from a display.

In addition, the substrate 100 may be partially bent to have a bent surface. That is, the substrate 100 may have a partial flat surface and a partial curved surface. In detail, an end of the substrate 100 may be bent to have a bent surface or may be bent or flexed to have a surface including a random curvature.

In addition, the substrate 100 may include a flexible substrate having a flexible property.

Further, the substrate 100 may include a curved or bended substrate. That is to say, even the fingerprint sensor including the substrate may be formed to have a flexible, curved or bended property. Accordingly, the fingerprint sensor according to the embodiment may be easily carried by a user or easily coupled and variously designed.

The support member 200 may be provided on the substrate 100. The support member 200 may include a plurality of sub-support members 210. For example, the support member 200 may include the sub-support members 210 spaced apart from each other.

The support member 200 will be described in detail later.

The piezoelectric layer 400 may be provided on the substrate 100. The piezoelectric layer 400 may include a piezoelectric film. For example, the piezoelectric layer 400 may include a transparent piezoelectric film, a semi-transparent piezoelectric film, or an opaque piezoelectric film.

The piezoelectric layer 400 may include various piezoelectric materials. For example, the piezoelectric layer 400 may include single crystal ceramics, polycrystalline ceramics, a polymer material, a thin film material, and a composite material of a polycrystalline material and a polymer material.

The piezoelectric material of the single crystal ceramics may include $\alpha$-AlPO$_4$, $\alpha$-SiO$_2$, LiTiO$_3$, LiNbO$_3$, Sr$_x$Ba$_y$Nb$_2$O$_3$, Pb$_5$—Ge$_3$O$_{11}$, Tb2(MnO4)3, Li$_2$B$_4$O$_7$, CdS, ZnO, or Bi$_2$SiO$_{20}$ or Bi$_2$GeO$_{20}$.

The piezoelectric material of the polycrystalline ceramics may include a PZT-based material, a PT-based material, a PZT-complex perovskite-based material, or BaTiO$_3$.

In addition, the piezoelectric material of the polymer material may include PVDF, P(VDF-TrFe), P(VDFTeFE), or TGS.

In addition, the piezoelectric material of the thin film material may include ZnO, CdS, or AlN.

Further, the piezoelectric material of the composition material may include PZT-PVDF, PZT-Silicon Rubber, PZT-Epoxy, PZT-foamed polymer, or PZT-foamed urethane.

The piezoelectric layer 400 according to the first embodiment may include a polymer piezoelectric material. For example, the piezoelectric layer 400 according to the first embodiment may include at least one of PVDF, P(VDF-TrFe) and P(VDFTeFE).

Figure 2:
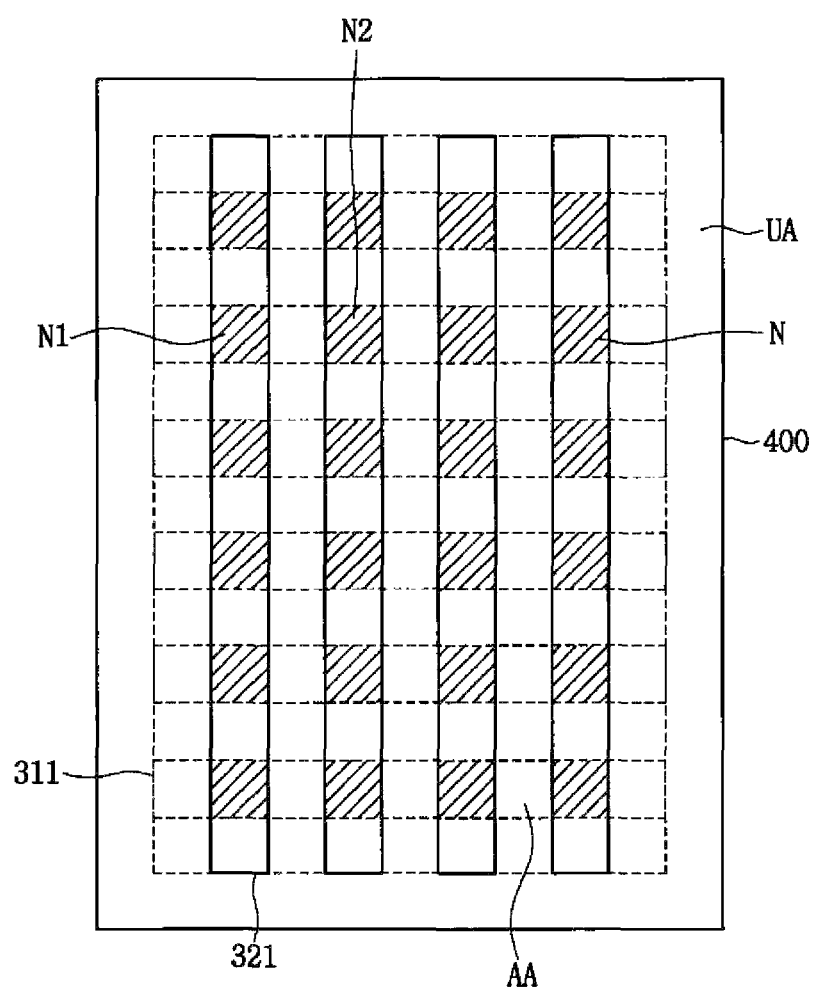
FIG. 2 is a plan view showing the fingerprint sensor according to the first embodiment.

Referring to FIG. 2, the piezoelectric layer 400 may include an active area AA and an unactive area UA defined therein.

The active area AA may be an area in which a fingerprint is recognized, and the unactive area UA provided at the peripheral portion of the active area AA is an area in which the fingerprint is not recognized.

In detail, if a finger approaches the active area AA or makes contact with the active area AA, a fingerprint can be recognized by a transmitted or received ultrasonic signal in the active area. The principle of operating the fingerprint sensor will be described in detail below.

The first electrode 310 and the second electrode 320 may be provided on the piezoelectric layer 400. For example, the first electrode 310 and the second electrode 320 may be provided on at least one of one surface of the piezoelectric layer 400 and an opposite surface of the piezoelectric layer 400.

Referring to FIGS. 1 and 2, the first electrode 310 may be provided on one surface of the piezoelectric layer 400, and the second electrode 320 may be provided an opposite surface of the piezoelectric layer 400. In other words, the first electrode 310 may be provided on the substrate 100. In addition, the first electrode 310 may be interposed between the substrate 100 and the piezoelectric layer 400.

At least one of the first and second electrodes 310 and 320 may include a conductive material.

For example, at least one of the first and second electrodes 310 and 320 may include a transparent conductive. For example, at least one of the first and second electrodes 310 and 320 may include metal oxide such as indium tin oxide (ITO), indium zinc oxide (IZO), copper oxide, tin oxide, zinc oxide, or titanium oxide. Since the transparent material is disposed on the active area, a degree of freedom may be improved when the electrode pattern is formed.

In addition, at least one of the first and second electrodes 310 and 320 may include a nanowire, a photo-sensitive nanowire film, a carbon nanotube (CNT), graphene, conductive polymer or a mixture thereof. Thus, when a flexible or bendable fingerprint sensor is manufactured, the degree of freedom may be improved.

When a nano-composite such as a nanowire or a carbon nanotube (CNT) is used, the electrode may be realized in black color, and the color and the control of the reflectance are possible while the electrical conductivity, is ensured by controlling in the content of nanopowders.

At least one of the first and second electrodes 310 and 320 may include various metals. For example, at least one of the first and second electrodes 310 and 320 may include at least one of Cr, Ni, Cu, Al, Ag, Mo, Au, Ti and the alloy thereof. Accordingly, when a flexible or bendable fingerprint sensor is manufactured, the degree of freedom may be improved At least one of the first and second electrodes 310 and 320 may be formed in a mesh shape. In detail, at least one of the first and second electrodes 310 and 320 may have a mesh shape by sub-electrodes crossing each other.

The mesh line width of the first and second electrodes 310 and 320 may be in the range of about 0.1 µm to about 10 µm. The mesh line having the width of about 0.1 µm or less is impossible due to the characteristic of the fabrication process, and may be shorted. In addition, if the mesh line has the width exceeding about 10 µm, the electrode pattern may be viewed from the outside, so that the visibility may be degraded. Preferably, the width of the mesh line may be in the range of about 0.5 µm to about 7 µm. More preferably, the width of the mesh line may be in the range of 1 µm to about 3.5 µm.

In addition, the mesh lines of the first and second electrodes 310 and 320 may be in the range of about 100 nm to about 500 nm. If the thickness of the mesh line is about 100 nm or less, the resistance of the electrode may be increased, so that the electrical characteristic may be degraded. If the thickness of the mesh line exceeds about 500 nm, the whole thickness of the fingerprint sensor may be increased, so that the process efficiency can be degraded. Preferably, the thickness of the mesh line may be in the range of about 150 nm to about 200 nm. More preferably, the thickness of the mesh line may be in the range of about 180 nm to about 200 nm.

The first and second electrodes 310 and 320 may be provided in the mesh shape through various schemes.

For example, a metal layer including an electrode material, such as copper (Cu), constituting the first and second electrodes 310 and 320 is provided on one surface of the piezoelectric layer 400, and etched in the mesh shape, so that the first and second electrodes may be formed in the mesh shape. In addition, a base substrate, for example, a resin layer is provided on one surface of the piezoelectric layer 400, and an intaglio pattern or an embossment pattern is formed in the resin layer using an intaglio mold or an embossment mold. Thereafter, the intaglio or embossment pattern may be filled with metallic paste including at least one metal of Cr, Ni, Cu, Al, Ag, Mo, and the alloy thereof and cured to form the first and second electrodes having an intaglio mesh shape or an embossment mesh shape.

The first and second electrodes 310 and 320 may be connected with a wire electrode provided in the unactive area UA. The wire electrode may be connected with a printed circuit board (not shown in drawings) provided in the unactive area UA.

The first and second electrodes 310 and 320 may cross each other. In detail, the first electrode 310 may include at least one first electrode pattern 311 extending in one direction, and the second electrode 320 may include at least second electrode pattern 321 extending in a direction different from the one direction.

Although FIG. 2 shows that the first electrode pattern 311 and the second electrode pattern 321 are formed in a bar pattern, the embodiment is not limited thereto. The first and second electrode patterns 311 and 321 may have various shapes such as a polygonal shape including a rectangular shape, a diamond shape, a pentagonal shape, or a hexagonal shape, or a circular shape.

Accordingly, the first electrode 310 and the second electrode 320 may include a node area N in which the first and second electrode patterns 311 and 321 extending in mutually different directions cross each other.

In the node area N, a signal may be transmitted or received by an object approaching or making contact with the piezoelectric layer 400. In detail, an ultrasonic signal can be transmitted from and received to the node area N. In other words, the node area N may include a sensor to recognize a fingerprint according to the approach or the contact of the finger.

At least one node area N may be provided on the piezoelectric layer 400. In detail, a plurality of node areas N may be provided on the piezoelectric layer 400. For example, the node area N may have the resolution of about 400 dpi to about 500 dpi with respect to the piezoelectric layer 400.

Accordingly, the interval between the node areas N may be about 100 μm or less. For example, the node area N may include first and second node areas N1 and N2 adjacent to each other. The first node area N1 may be spaced apart from the second node area N2 by an interval of about 100 μm or less.

For example, at least one of a first interval between the first electrode patterns 311 and a second interval between the second electrode patterns 321, which constitute the node areas N, may be about 100 μm or less, in detail, about 70 μm or less, in more detail, about 50 μm or less.

If the interval between the node areas N exceeds about 50 μm, the resolution of the node areas N may be degraded. Accordingly, the ultrasonic signal transmitted from and received to the node areas N is weakened, so that the fingerprint cannot be accurately recognized. Accordingly, the reliability of the fingerprint sensor may be degraded.

The node area N can simultaneously transmit and receive the ultrasonic signal. In detail, when the finger approaches or makes contact with the node area N, the ultrasonic signal can be transmitted in a finger direction in the node area N, and the ultrasonic signal reflected by the finger may be received to the node area N. The fingerprint sensor according to the embodiment can recognize the fingerprint due to the difference between the transmitted and received signals.

Figure 3:
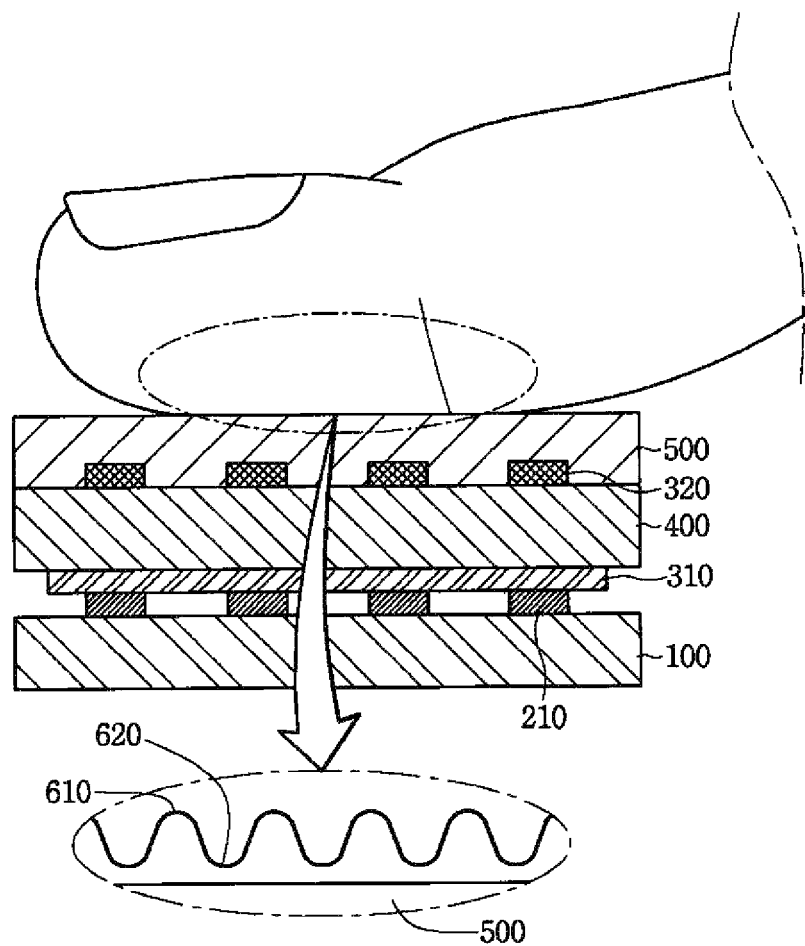
FIG. 3 is a sectional view to explain the operating principle of the fingerprint sensor.

FIG. 3 is a view to explain the operation of the fingerprint sensor as the finger makes contact with or approaches the fingerprint sensor.

Referring to FIG. 3, as the voltage having a resonance frequency in an ultrasonic signal band is applied to the first and second electrodes 310 and 320 provided on one surface and an opposite surface of the piezoelectric layer 400 from an external control unit, an ultrasonic signal can be generated from the piezoelectric layer 400.

Regarding the ultrasonic signal, when the finger does not make contact with or approach the node area, most parts of the ultrasonic signal transmitted from the node area N of the piezoelectric layer 400 return into the piezoelectric layer 400 without passing through the interface between the piezoelectric sensor and the air due to the difference in acoustic impedance between the air and the node area N of the piezoelectric layer 400 to transmit the ultrasonic signal.

Meanwhile, as shown in FIG. 3, when the finger approaches or makes contact with the node area N, a portion of the ultrasonic signal transmitted from the node area N of the piezoelectric layer 400 propagates into the finger through the interface between the skin of the finger and the piezoelectric layer 400. Accordingly, the intensity of the signal reflected and returning is lowered, so that the fingerprint pattern can be detected.

Although it is difficult to recognize the pattern of the fingerprint with a naked eye of a user, the fingerprint may have a pattern that numerous ridges and valleys are repeated. As the valleys and the ridges are repeated, the variation in the height between the valley and the ridge may occur. Accordingly, as shown in FIG. 3, the piezoelectric layer 400 does not directly make contact with the skin in a valley 610 of the fingerprint, but may directly make contact with the skin in a ridge 620 of the fingerprint.

Accordingly, the ultrasonic signal transmitted from the node area N of the piezoelectric layer 400 corresponding to the valley 610 of the fingerprint extremely slightly is transmitted to the outside, and most parts of the ultrasonic signal are reflected toward the inside and received, to the node area N. A great amount of an ultrasonic signal transmitted from the node area N of the piezoelectric layer 400 corresponding to the ridge 620 of the fingerprint is propagated through the boundary surface of the finger and reflected, so that the intensity of the ultrasonic signal received to the node area N is significantly reduced.

Accordingly, the fingerprint pattern can be detected by measuring the intensity or the reflection coefficient of the ultrasonic signal, which is reflected and received due to the difference in acoustic impedance, according to the valley 610 and the ridge 620 of the fingerprint in each node area N.

Referring to FIGS. 4 to 7, the support member 200 described above may be provided on the substrate 100. In detail, the support member 200 may be interposed between the substrate 100 and the piezoelectric layer 400. In detail, the support member 200 may be interposed between the substrate 100 and the first electrode 310. In other words, the support member 200 may be provided on the substrate 100 to support the first electrode 310 or the piezoelectric layer 400.

The support member 200 may include a plurality of sub-support members 210. The sub-support members 210 may be spaced apart from each other. The sub-support members 210 may be spaced apart from each other on the entire surface of the substrate 100. However, the embodiment is not limited thereto, but the sub-support members 210 may be provided on the entire surface of the substrate 100.

Figure 4:
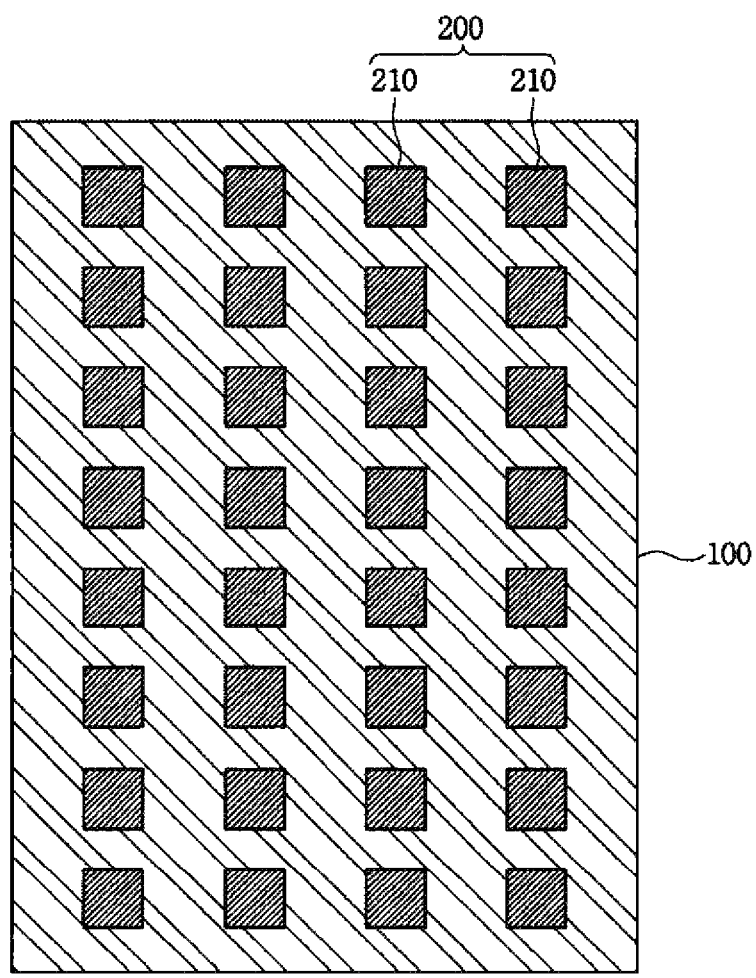
FIG. 4 is a plan view to explain the position of the support member.
Figure 5:
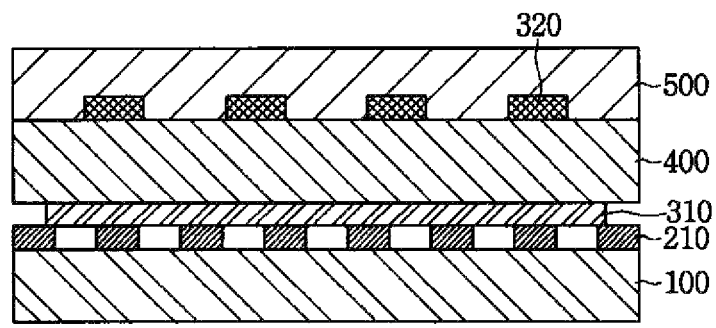
FIG. 5 is a sectional view taken along line A-A' of FIG. 1.

Referring to FIGS. 4 and 5, the sub-support members 20 may be provided on both of an overlap area OA where the first electrode 310 is overlapped with the second electrode 320 and a non-overlap area NOA where the first electrode 310 is not overlapped with the second electrode 320 on the substrate 100. For example, the sub-support member 210 may extend in a direction the same as a direction that at least one of the first electrode 310 and the second electrode 320 extends.

In addition, although FIG. 5 shows that a space exists between the sub-support members, the embodiment is not limited thereto. In other words, an intermediate layer may be filled in the space between the sub-support members, and may include a material the same as or similar to that of the piezoelectric layer.

The sub-support members may be spaced apart from each other by the intermediate layer. The interference between the sub-support members can be minimized.

Figure 6:
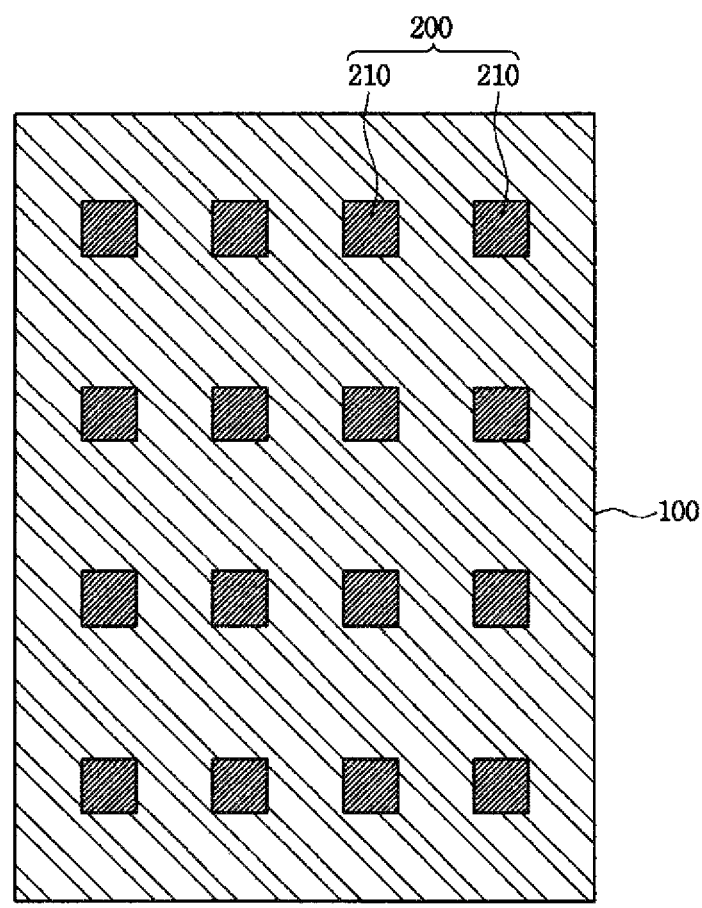
FIG. 6 is a plan view to explain the position of the support member.
Figure 7:
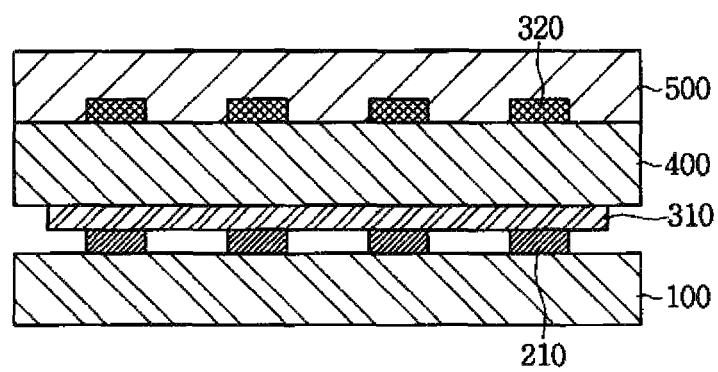
FIG. 7 is a sectional view taken along line A-A' of FIG. 1.

In addition, referring to FIGS. 6 and 7, the sub-support member 210 maybe provided on the substrate 100 and may be provided only in the overlap area OA where the first electrode 310 are overlapped with the second electrode 320. For example, the sub-support member 210 may be provided on the node area N of the overlap area OA where overlapped the first electrode 310 is overlapped with the second electrode 320. In other words, the sub-support member 210 may be provided in a position corresponding to the node area N. However, the embodiment is not limited thereto, but the sub-support member 210 may be provided on the entire surface of the substrate 100.

In addition, although FIG. 7 shows that the space exists between the sub-support members, the embodiment is not limited thereto. In other words, the intermediate layer may be filled in the space between the sub-support members, and may include a material the same as or similar to that of the piezoelectric layer.

The sub-support members may be spaced apart from each other by the intermediate layer, and the interference between the sub-support members may be minimized.

The support member 200 may include a non-conductive material. In addition, the support member 200 may include resin. For example, the support member 200 may include silicone, urethane, or acrylic resin.

The support member 200 may be formed by disposing a metallic layer on the substrate 100.

In detail, a metallic layer including aluminum (Al) is disposed on the substrate 100, and anodized. Accordingly, the metallic layer may be formed in the surface thereof with nano-sized holes regularly arranged. For example, several tens or hundreds of nanometer holes may be uniformly formed in the surface of the metallic layer.

Thereafter, after resin is filled in the holes formed in the surface of the metallic layer, a nano-size support member 200, that is, a plurality of sub-support members 210 may be formed.

In this case, the support member 200 may have the height of about 0.1 μm to about 1 μm. If the height of the support member 200 is less than about 0.1 μm, the support member 200 cannot perform a sufficient buffer function between the piezoelectric layer 400 and the substrate 100. If the height of the support member 200 exceeds about 1 μm, the whole thickness of the fingerprint sensor may be increased.

The support member 200 may be interposed between the substrate 100 and the piezoelectric layer 400 to perform a buffer function between the piezoelectric layer 400 and the substrate 100. In other words, when an object such as a finger makes contact with or touches the piezoelectric layer 400, the piezoelectric layer 400 can be prevented from directly making contact with the substrate 100 by the support member 200 provided on the substrate 100.

Accordingly, when the piezoelectric layer 400 makes contact with or touches an object, since the piezoelectric layer does make contact with the substrate 100, the vibration generated from the piezoelectric layer 400 does not interfere with the substrate 100. Accordingly, the sensing property of the fingerprint sensor can be improved.

A cover substrate 500 may be further provided on the second electrode 320. The cover substrate 500 may include a material the same as or similar to that of the above-described substrate.

A decoration layer may be provided in predetermined color on the cover substrate 500. For example, a decoration layer may be further provided at one area of the cover substrate to match the color of peripheral components or the package of the fingerprint sensor provided at one area of the cover substrate 500 with the color of the cover substrate 500.

Hereinafter, the fingerprint sensor according to another example of the first embodiment will be described with reference to FIGS. 8 to 14. In the following description of the fingerprint sensor according to another example of the first embodiment, the description the same as or similar to the above description of the fingerprint sensor according to the first embodiment will be omitted, and the same reference numerals will be assigned to the same elements.

Figure 8:
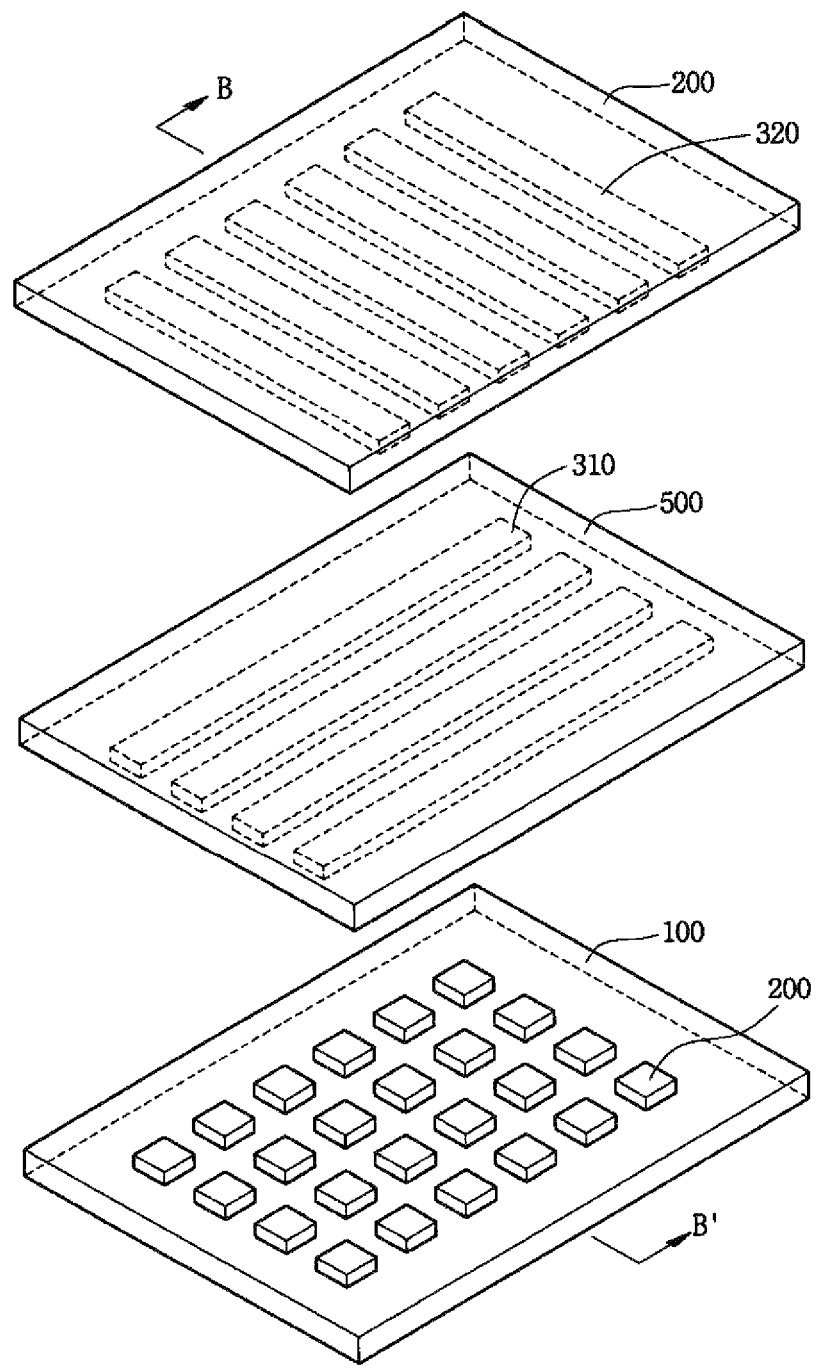
FIG. 8 is a perspective view showing the fingerprint, sensor according to another example of the first embodiment.
Figure 9:
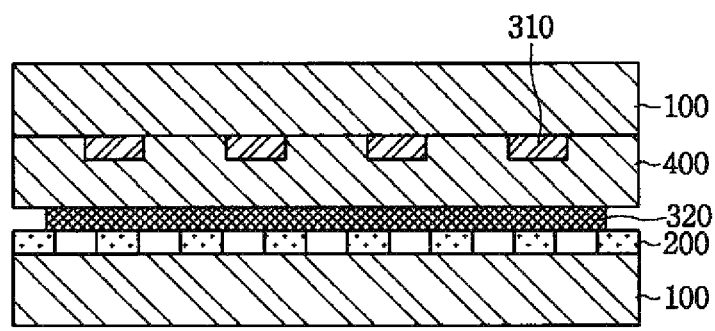
FIG. 9 is a sectional view taken along line B-B' of FIG. 8.
Figure 10:
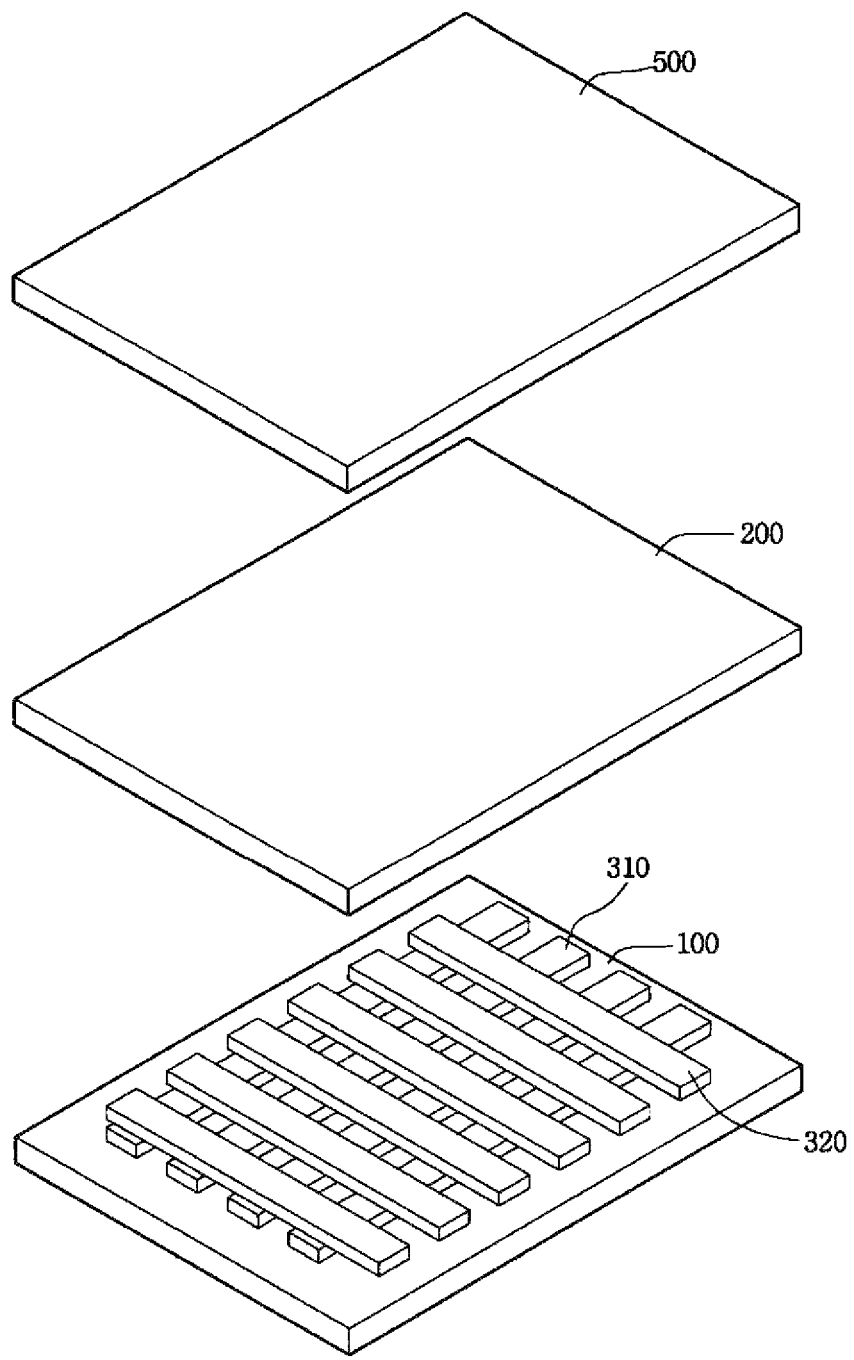
FIG. 10 is a perspective view showing the fingerprint sensor according to still another example of the first embodiment.

Referring to FIGS. 8 and 9, in the fingerprint sensor according to another example of the first embodiment, the first electrode and the second electrode may be provided at mutually different positions.

For example, the first electrode 310 may be provided on one surface of the cover substrate 500. In addition, the second electrode 320 may be provided on one surface of the piezoelectric layer 400.

Identically to that of the first embodiment, the first electrode 310 and the second electrode 320 may include at least one first electrode pattern 311 and at least one second electrode pattern 321 extending in mutually different direction. The node area N may be formed in an area that the first and second electrode patterns 311 and 321 cross each other. In addition, the ultrasonic signal can be transmitted or received in the node area N.

In addition, the support member 200 may be provided on the substrate 100 to support the first electrode 310, the second electrode 320, the piezoelectric layer 400, and the cover substrate 500. The support member 200 may include a plurality of sub-support members 210 spaced apart from each other.

In addition, although FIG. 8 shows the sub-support members 210 extending in a direction, the same as a direction that at least one of the first electrode 310 and the second electrode 320 extends, the embodiment is not limited. In other words, the sub-support members 210 may be formed only in the node area N in which the first electrode 310 and the second electrode 320 cross each other.

In addition, although FIG. 9 shows that the space exists between the sub-support members, the embodiment is not limited thereto. In other words, the intermediate layer may be filled in the space between the sub-support members, and may include a material the same as or similar to that of the piezoelectric layer.

Referring to FIGS. 10 to 14, in the fingerprint sensor according to another example of the first embodiment, the first and second electrodes may be provided at mutually different positions.

In detail, the first electrode 310 and the second electrode 320 may be provided at the same position in a fingerprint sensor according to the third embodiment.

For example, the first electrode 310 and the second electrode 320 may be provided on the same surface of the substrate 100. In this case, first electrodes 310 may be connected with each other, and second electrodes 320 may be disconnected from each other.

Figure 11:
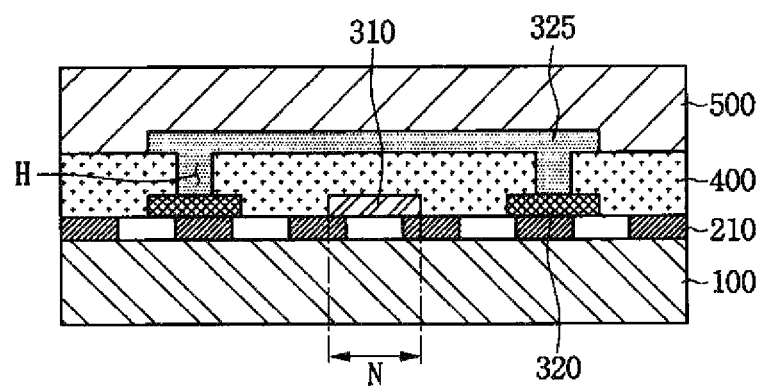
FIGS. 11 to 14 are sectional views showing various structures of the fingerprint sensor according to still another embodiment of the first embodiment.

Referring to FIG. 11, the support member 200 may be provided on the substrate 100. The support member 200 may include a plurality of sub-support members 210 spaced apart from each other.

In addition, the sub-support members 210 may be provided while in a direction the same as a direction that at least one of the first electrode 310 and the second electrode 320 extend, or may be provided only in the node area N that the first electrode 310 crosses the second electrode 320.

The piezoelectric layer 400 may be provided on the substrate 100. In detail, the piezoelectric layer 400 may cover the support member 200, the first electrode 310, and the second electrode 320 provided on the substrate 100.

The piezoelectric layer 400 may be formed therein with a hole H. In detail, the piezoelectric layer 400 may be formed therein with the hole H to expose one surface of the second electrode 320.

The piezoelectric layer 400 may be provided thereon with a connection electrode 325. In detail, the connection electrode 325. In detail, the connection electrode 325 may connect the second electrodes 320 with each other through the hole H.

In this case, the first electrode 310 and the connection electrode 325 may be provided at positions overlapped with each other. In other words, the first electrode 310 and the second electrode 320 may be provided on and under the piezoelectric layer 400 by the connection electrode 325. The node area N to transmit the ultrasonic signal may be formed at the position at which the first electrode 310 is overlapped with the connection electrode 325.

Figure 12:
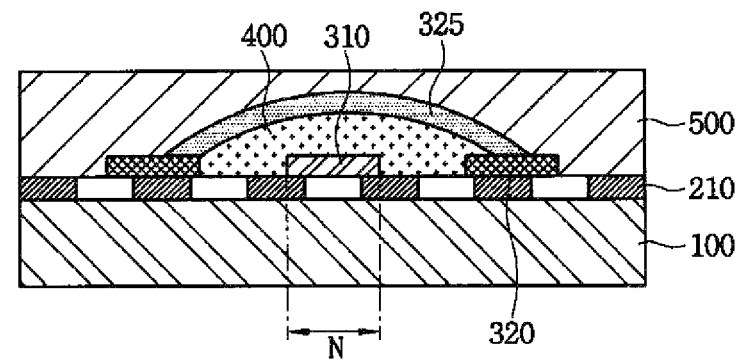

Referring to FIG. 12, the piezoelectric layer 400 may be provided on the substrate 100. In detail, the piezoelectric layer 400 may be provided on a portion of the substrate 100. For example, the piezoelectric layer 400 may cover the first electrode 310.

The connection electrode 325 may be provided on the piezoelectric layer 400. In detail, the connection electrode 325 may be provided on the piezoelectric layer 400 to connect the second electrodes 320, which are adjacent to the first electrode 310 and provided on the same surface of the substrate 100, with each other.

In this case, the first electrode 310 may be overlapped with the connection electrode 325. In other words, the first and second electrodes 310 and 320 may be provided on and under the piezoelectric layer 400 by the connection electrode 325. The node area N to transmit the ultrasonic signal may be formed at the position at which the first electrode 310 and the connection electrode 325 are overlapped with each other. In other words, the piezoelectric layer 400 may be overlapped with the node area N on the substrate 100.

Although FIGS. 11 and 12 show that the piezoelectric substrate is provided on the first and second electrodes, the embodiment is not limited thereto. In other words, the first and second electrodes may be provided on the piezoelectric substrate.

Figure 13:
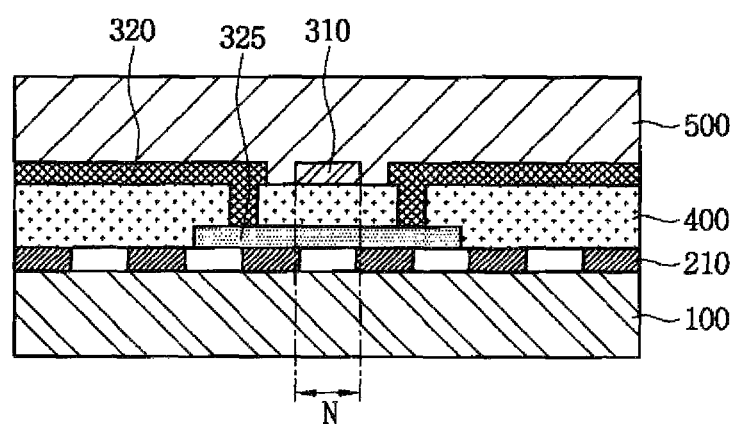

Referring to FIG. 13, the connection electrode 325 is provided on the substrate 100. The piezoelectric layer 400 may be provided to surround the connection electrode 325. The piezoelectric layer 400 may be formed therein with holes to expose one surface of the connection electrode 325.

The first and second electrodes 310 and 320 may be provided on the piezoelectric layer 400. For example, the first electrode 310 may be provided on the piezoelectric layer 400, and the second electrode 320 may be provided on the piezoelectric layer 400 having the hole therein. The second electrode 320 may be connected with the connection electrode 325 through the hole so that the second electrodes 320 may be connected with each other.

In this case, the first electrode 310 may be overlapped with the connection electrode 325. In other words, the first electrode 310 and the second electrode 320 may be provided on and under the piezoelectric layer 400 by the connection electrode 325, and the node area N to transmit the ultrasonic signal may be formed at a position at which the first electrode 310 is overlapped with the connection electrode 325.

Figure 14:
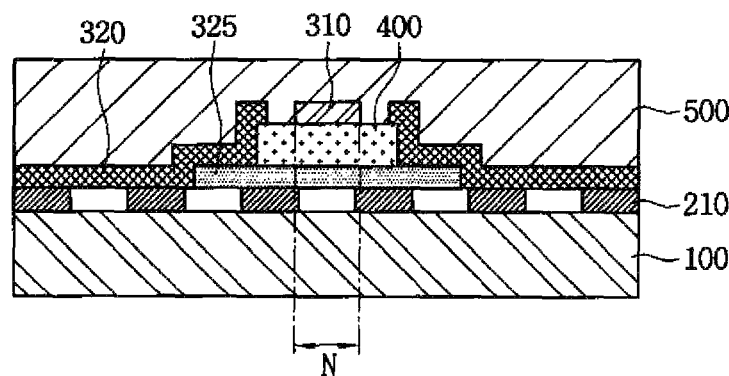

Referring to FIG. 14, the connection electrode 325 may be provided on the substrate 100, and the piezoelectric layer 400 may be provided on the connection electrode 325. The piezoelectric layer 400 may be provided on one area of the connection electrode 325. In other words, the piezoelectric layer 400 may be partially provided on the connection electrode 325.

The first and second electrodes 310 and 320 may be provided on the piezoelectric layer 400. For example, the first electrode 310 may be provided on the piezoelectric layer 400, and the second electrode 320 may be provided on the piezoelectric layer 400 while making contact with the connection electrode 325. Accordingly, the second electrodes 320 spaced apart from each other may be connected with each other by the connection electrode 325.

In this case, the first electrode 310 may be overlapped with the connection electrode 325. In other words, the first and second electrodes 310 and 320 may be provided on and under the piezoelectric layer 400, respectively, by the connection electrode 325, and the node area N to transmit the ultrasonic signal may be formed at a position at which the first electrode 310 is overlapped with the connection electrode 325. In other words, the piezoelectric layer 400 is provided on the connection electrode 325 while being overlapped with the node area N.

In addition, according to the fingerprint sensor of FIGS. 11 to 14, an adhesive layer may be provided between the cover substrate 500 and the first and second electrodes 310 and 320 to maintain the flatness of the cover substrate 500 and to efficiently bond the cover substrate with the electrodes.

Meanwhile, the piezoelectric layer 400 may be transparent. For example, the piezoelectric layer 400 may have a haze value in a predetermined range.

The piezoelectric layer 400 may have a haze value of about 4% or less. In detail, the piezoelectric layer 400 may have a haze value of about 2% or less. In more detail, the piezoelectric layer 400 may have a haze value in the range of about 1% to about 2%.

If the haze value of the piezoelectric layer 400 is about 4% or more, white turbidity may occur on the piezoelectric layer 400, so that the piezoelectric layer 400 may be viewed from the outside. Accordingly, when the fingerprint sensor according to the embodiment is provided in a display area, the piezoelectric layer 400 can be viewed from the outside, so that the visibility may be degraded.

The piezoelectric layer 400 according to the embodiment may be formed in the following process.

First, a material constituting the piezoelectric layer 400 may be dispersed into a solvent to form a mixture. In detail, piezoelectric powders including at least one of PVDF, P(VDF-TrFe) and P(VDFTeFE) may be introduced in a solvent including at least one of DMSO (Dimethyl sulfoxide), 2-Butoxyethanol, and DMF (N,N Dimethyl Formamideormamide), and the powders and the solvent may be mixed together to form the mixture.

Thereafter, the mixture may be coated on a target substrate. For example, the mixture may be coated on various substrates described above.

Then, the mixture coated on the substrate may be dried. For example, the mixture may be dried at the temperature of about 60 t to about 70 r.

Subsequently, the mixture coated on the substrate may be cured. For example, the substrate coated with the mixture may be aged at the temperature of about 90 t or less.

Hereinafter, the disclosure will be described in more detail through embodiments and comparison examples. The embodiments are provided only for the illustrative purpose, and the disclosure is not limited thereto.

Experimental Example 1

P(VDF-TrFe) powders were mixed with a DMF solvent. In this case, the P(VDF-TrFe) powders and the DMF solvent were mixed so that the weight ratio of the P(VDF-TrFe) powders to the DMF solvent was about 7:3.

Thereafter, the P(VDF-TrFe) powders and the DMF solvent were mixed with each other for about 24 hours and the mixture was coated on a PET substrate.

Then, the mixture was mixed at the temperature of about 60 t to about 70° C.

Subsequently, the mixture was aged for about 2 hours at the temperature of about 90° C., so that the piezoelectric layer was formed on the substrate.

Thereafter, the haze of the piezoelectric layer was measured.

Experimental Example 2 a piezoelectric layer according to experimental example 2 was formed in the same manner as that of experimental example 1 except that a DMSO solvent was used and the haze of the piezoelectric layer was measured.

Experimental Example 3

A piezoelectric layer according to experimental example 3 was formed in the same manner as that of experimental example 1 except that a solvent having DMSO and 2-Butoxyethanol mixed at the weight ratio about 8:2 was used, and the haze of the piezoelectric layer was measured.

Comparison Example 1

A piezoelectric layer according to comparison example 1 was formed in the same manner as that of experimental example 1 except that an aging temperature was about 120° C., and the haze of the piezoelectric layer was measured.

Comparison Example 2

A piezoelectric layer according to comparison example 2 was formed in the same manner as that of experimental example 2 except that an aging temperature was about 120° C., and the haze of the piezoelectric layer was measured.

Comparison Example 3

A piezoelectric layer according to comparison example 3 was formed in the same manner as that of experimental example 3 except that an aging temperature was about 120° C., and the haze of the piezoelectric layer was measured.

Comparison Example 4

A piezoelectric layer according to comparison example 4 was formed in the same manner as that of experimental example 4 except that an aging temperature was about 140° C., and the haze of the piezoelectric layer was measured.

Comparison Example 5

A piezoelectric layer according to comparison example 5 was formed in the same manner as that of experimental example 2 except that an aging temperature was about 140° C., and the haze of the piezoelectric layer was measured.

Comparison Example 6

A piezoelectric layer according to comparison example 6 was formed in the same manner as that of experimental example 3 except that an aging temperature was about 140° C., and the haze of the piezoelectric layer was measured.

Comparison Example 7

A piezoelectric layer according to comparison example 7 was formed in the same manner as that of experimental example 1 except that an aging time was about 5 hours, and the haze of the piezoelectric layer was measured.

Comparison Example 8

A piezoelectric layer according to comparison example 8 was formed in the same manner as that of experimental example 2 except that an aging time was about 5 hours, and the haze of the piezoelectric layer was measured.

Comparison Example 9

A piezoelectric layer according to comparison example 8 was formed in the same manner as that of experimental example 3 except that an aging time was about 5 hours, and the haze of the piezoelectric layer was measured.

TABLE 1

| | Aging temperature (° C.) | Aging time (hour) | Haze value (%) |
|---|---|---|---|
| Experimental example 1 | 85 | 2 | 1.33 |
| Experimental example 2 | 90 | 2 | 1.98 |
| Experimental example 3 | 95 | 2 | 2.00 |
| Comparison example 1 | 120 | 2 | 3.83 |
| Comparison example 2 | 120 | 2 | 4.98 |
| Comparison example 3 | 120 | 2 | 5.76 |
| Comparison example 4 | 140 | 2 | 4.59 |
| Comparison example 5 | 140 | 2 | 6.26 |
| Comparison example 6 | 140 | 2 | 6.56 |
| Comparison example 7 | 90 | 5 | 1.26 |
| Comparison example 8 | 90 | 5 | 2.25 |
| Comparison example 9 | 90 | 5 | 1.90 |

Referring to table 1, the piezoelectric layers according to experimental example 1 to experimental example 3 have haze values of about 2.0% or less.

Meanwhile, the piezoelectric layers according to comparison example 1 to comparison example 3 have haze values exceeding about 2.0%, in detail, haze values exceeding 4.0%.

In other words, the piezoelectric layer formed at the aging temperature of about 90° C. or less shows low white turbidity during the process. Accordingly, the piezoelectric layer has a low haze value.

On the contrary, the piezoelectric layer formed at the aging temperature exceeding about 90° C. or less shows high white turbidity during the process. Accordingly, the piezoelectric layer has a high haze value, and the transparency of the piezoelectric layer is lowered.

In addition, referring to comparison example 7 to 9, the aging time does not exert a great influence on the haze value of the piezoelectric layer.

In other words, the fingerprint sensor according to the embodiment may include a piezoelectric layer having a low haze value, so that the visibility can be improved.

In detail, when the fingerprint sensor is provided in a display area in which an image is displayed, and when the piezoelectric layer having a high haze value is provided, the piezoelectric layer is viewed from the outside, so that the visibility can be degraded.

On the contrary, according to the fingerprint sensor of the embodiment, the piezoelectric layer having improved transparency can be realized by, reducing the haze value. Accordingly, even when the fingerprint sensor is provided at the display area in which the image is displayed, the piezoelectric layer can be prevented from being viewed from the outside, so that visibility can be improved.

Hereinafter, the fingerprint sensor according to the second embodiment will be described with reference to FIGS. 15 to 26. In the following description of the fingerprint sensor according to the second embodiment, the description the same as or similar to the above description of the fingerprint sensor according to the first embodiment will be omitted, and the same reference numerals will be assigned to the same elements.

Referring to FIGS. 15 to 26, the fingerprint sensor according to the second embodiment may include the substrate 100, the first electrode 310, the second electrode 320, and the piezoelectric layer 400.

Figure 15:
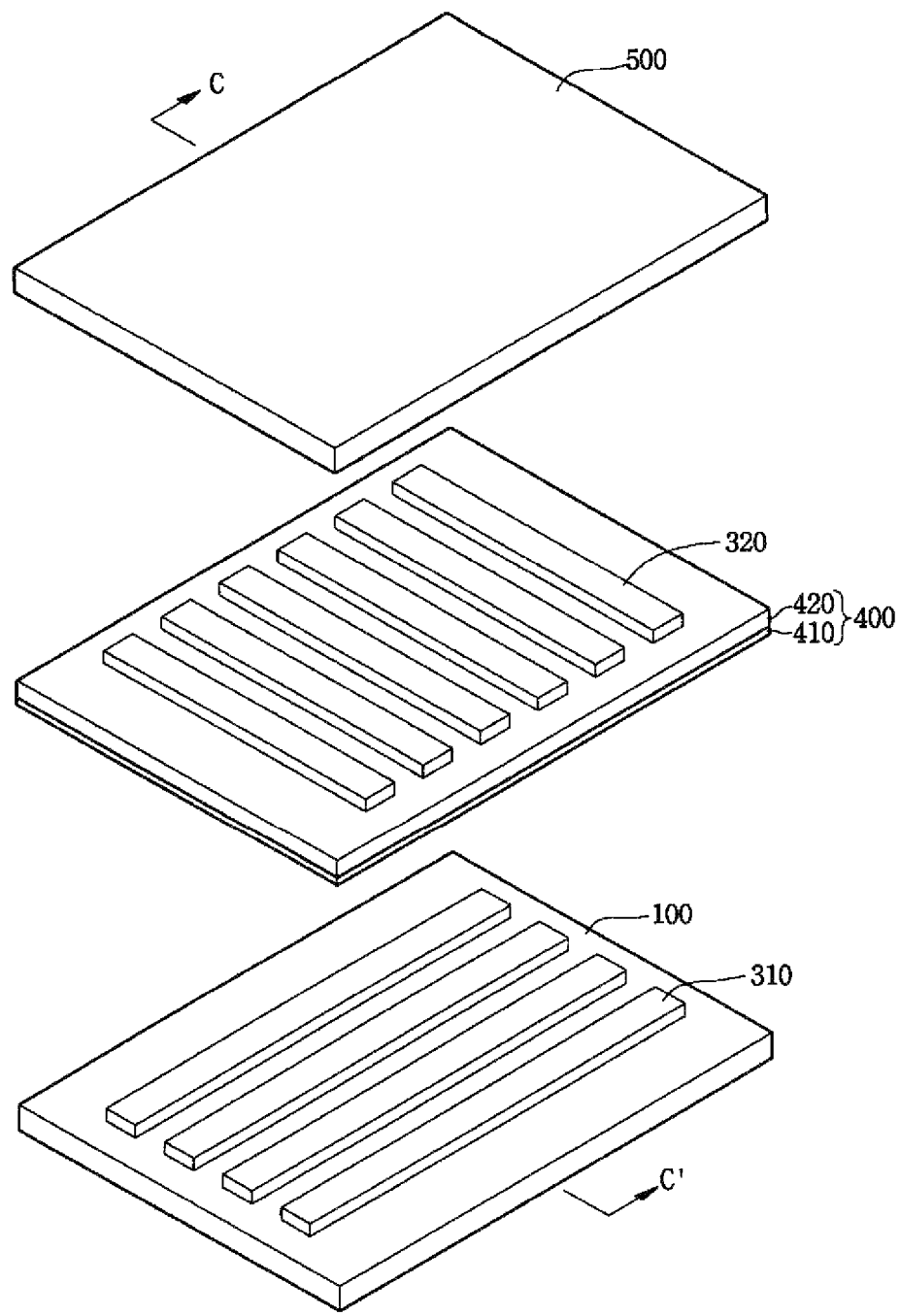
FIG. 15 is a perspective view showing a fingerprint sensor according to the second embodiment.

Referring to FIG. 15, the first electrode 310, the second electrode 320, and the piezoelectric layer 400 may be provided on the substrate 100. Since the first electrode 310 and the second electrode 320 are the same as or similar to those of the fingerprint sensor 13, the details thereof will be omitted.

Referring to FIGS. 16 to 19, the piezoelectric layer 400 may include at least two layers. In detail, the piezoelectric layer 400 may include a first piezoelectric layer 310 and a second piezoelectric layer 320.

The first piezoelectric layer 410 and the second piezoelectric layer 420 may be provided on the substrate 100.

The first piezoelectric layer 410 may be provided on the first electrode 310.

Figure 16:
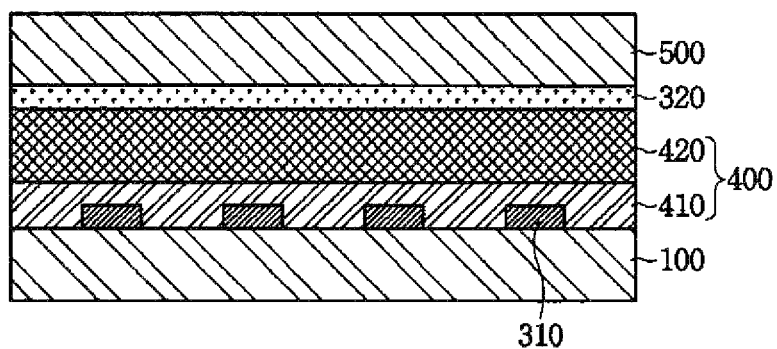
FIGS. 16 and 17 are sectional views taken along line C-C' of FIG. 15.

Referring to FIG. 16, the first piezoelectric layer 410 may be provided on the entire surface of the substrate 100. For example, the first piezoelectric layer 410 may be provided on the entire surface of the substrate 100 while surrounding the first electrode 310. In other words, the first electrode 310 may make contact with the top surface and the lateral side of the first electrode.

In addition, the second piezoelectric layer 420 may be provided on the first piezoelectric layer 410. The second piezoelectric layer 420 may make contact with the first piezoelectric layer 410.

The first piezoelectric layer 410 and the second piezoelectric layer 420 may include mutually different materials.

For example, at least one of the first and second piezoelectric layers 410 and 420 may include a piezoelectric film. For example, at least one of the first and second piezoelectric layers 410 and 420 may include a transparent piezoelectric film, a semi-transparent piezoelectric film, or an opaque piezoelectric film.

At least one of the first and second piezoelectric layers 410 and 420 may include various piezoelectric materials. For example, at least one of the first and second piezoelectric layers 410 and 420 may include single crystal ceramics, polycrystalline ceramics, a polymer material, a thin film material, and a composite material of a polycrystalline material and a polymer material.

Preferably, the first piezoelectric layer 410 may include a piezoelectric material of polycrystalline ceramics, and the second piezoelectric layer 420 may include a piezoelectric material of the polymer material.

For example, the first piezoelectric layer 410 may include a PZT-based material. In addition, the second piezoelectric layer 420 may include a PVDF piezoelectric material.

The PZT-based piezoelectric material may have an excellent transmission characteristic, and the PVDF piezoelectric material may have a wide resonance frequency band characteristic, so that the piezoelectric layer 400 including the first and second piezoelectric layers 410 and 420 may have a wide resonance frequency band characteristic and an excellent transmission characteristic.

The first piezoelectric layer 410 and the second piezoelectric layer 420 may be provided with mutually different thicknesses. For example, the thickness of the first piezoelectric layer 410 may be smaller than that of the second piezoelectric layer 420.

The first piezoelectric layer 410 may be provided with the thickness of about 0.1 μm to about 1 μM on the substrate 100. In detail, the first piezoelectric layer 410 may be provided with the thickness of about 0.3 μm to about 0.8 μm on the substrate 100. In detail, the first piezoelectric layer 410 may be provided with the thickness of about 0.4 μm to about 0.6 μm on the substrate 100.

If the first piezoelectric layer 410 has the thickness of less than about 0.1 μm, the first piezoelectric layer 410 may not have a sufficient transmission characteristic. If the first piezoelectric layer 410 has the thickness exceeding about 1 μm, the whole thickness of the fingerprint sensor may be increased.

Figure 17:
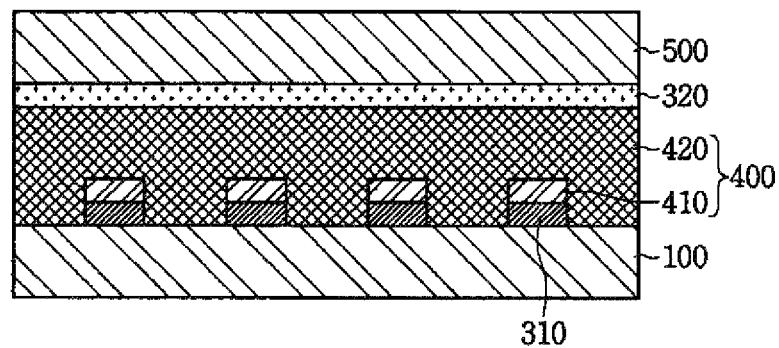
Figure 18:
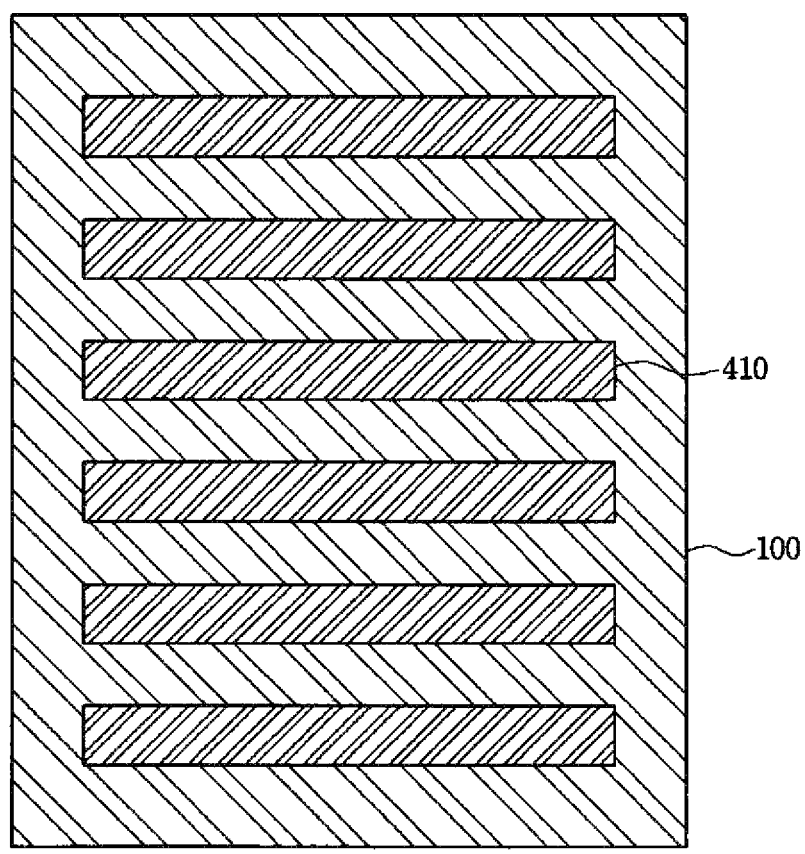
FIGS. 18 and 19 are sectional views to explain the arrangement positions of the second piezoelectric layer.
Figure 19:
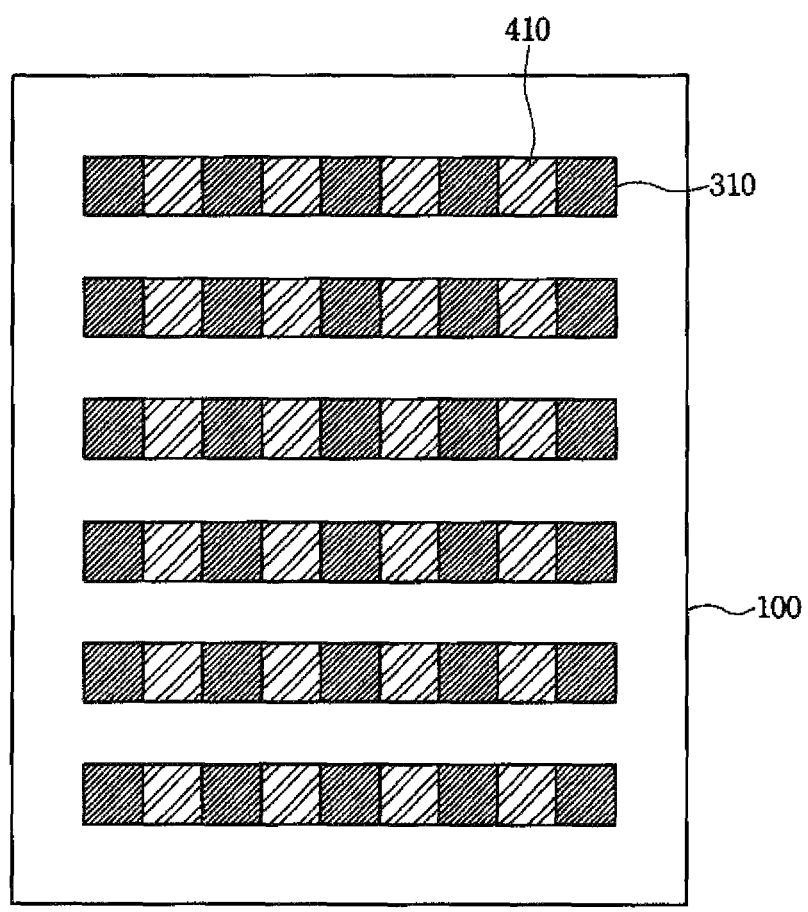

Referring to FIGS. 17 to 19, the first piezoelectric layer 410 may be provided corresponding to at least one of the first electrode 310 and the second electrode 320.

For example, referring to FIGS. 17 and 18, the first piezoelectric layer 410 may extend in the same direction as a direction that the first electrode 310 extends. In other words, the first piezoelectric layer 410 may be provided only on the first electrode 310. In other words, the first piezoelectric layer 410 may be provided at an overlapped area with an area in which the first electrode 310 is provided.

Accordingly, the substrate 100 is provided thereon with an area in which only the first piezoelectric layer 410 is provided and an area in which both of the first piezoelectric layer 410 and the second piezoelectric layer 420 are provided.

Referring to FIGS. 17 and 19, the first piezoelectric layer 410 may be provided on an area of the first electrode 310 in which the first electrode 310 is overlapped with the second electrode 320. In other words, the first piezoelectric layer 410 may be provided on the node area N. In other words, the first piezoelectric layer 410 may be provided on an area of the first electrode 310 corresponding to the node area N.

The first piezoelectric layer 410 is provided only on the node area N to reduce the stress occurring in the first piezoelectric layer 410 when the fingerprint sensor is bent or folded, thereby preventing cracks from occurring in the first piezoelectric layer 410. Accordingly, the reliability of the fingerprint sensor can be improved.

Although FIGS. 16 to 19 show that the first piezoelectric layer 410 including PZT is provided on the substrate 100, and the second piezoelectric layer 420 including PVDF is provided on the first piezoelectric layer 410, the embodiment is not limited thereto. In other words, the second piezoelectric layer 420 including the PVDF may be provided on the substrate 100, and the first piezoelectric layer 410 including the PZT may be provided on the second piezoelectric layer 420.

Hereinafter, the fingerprint sensor according to another example of the second embodiment will be described with reference to FIGS. 20 to 26. In the following description of the fingerprint sensor according to another example of the second embodiment, the description the same as or similar to the above description of the fingerprint sensor according to the second embodiment will be omitted, and the same reference numerals will be assigned to the same elements.

Figure 20:
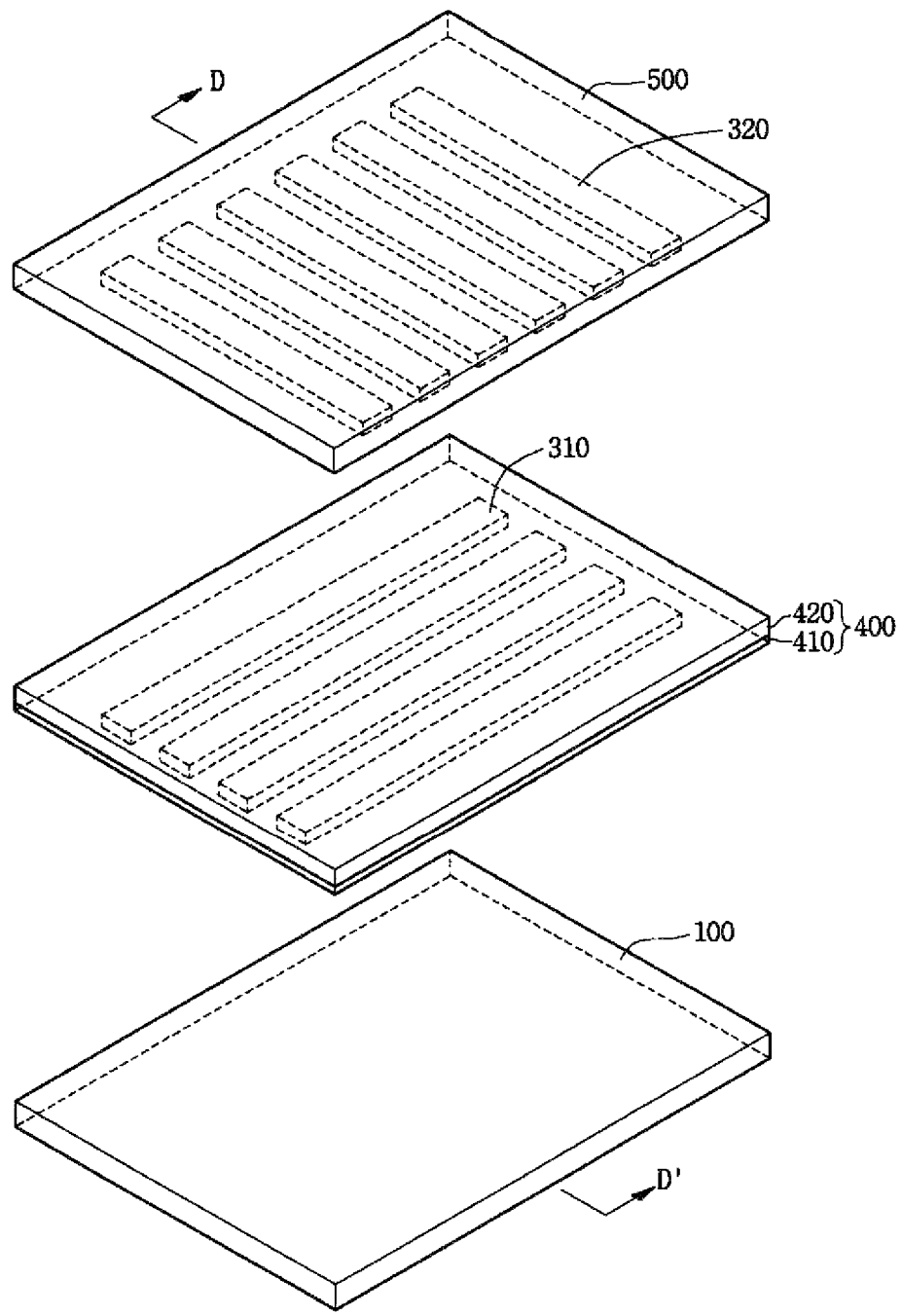
FIG. 20 is a perspective view showing the fingerprint sensor according to another example of the second embodiment.
Figure 21:
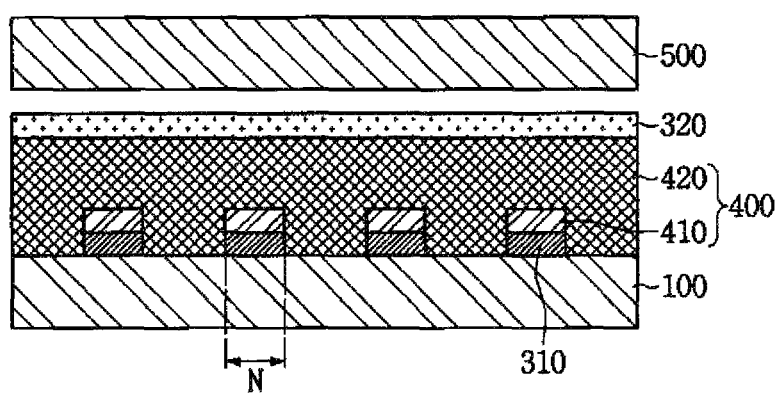
FIG. 21 is a sectional view taken along D-D' of FIG. 20.

Referring to FIGS. 20 and 21, in the fingerprint sensor according to another example of the second embodiment, the first electrode and the second electrode may be provided on mutually different positions.

For example, the first electrode 310 may be provided on one surface of the cover substrate 500. In addition, the second electrode 320 may be provided on one surface of the piezoelectric layer 400. The second electrode 320 may be provided on one surface of the first piezoelectric layer 410 or the second piezoelectric layer 420.

Identically to those of the first embodiment, the first electrode 310 and the second electrode 320 may include at least one first electrode pattern and at least one second electrode pattern in mutually different directions. The node area N may be formed in an area that the first and second electrode patterns cross each other. In addition, the ultrasonic signal can be transmitted or received in the node area N.

In addition, the piezoelectric layer 400 may include mutually different materials, and may include the first piezoelectric layer 410 and the second piezoelectric layer 420 provided with mutually different thicknesses. In addition, identically to that of the first embodiment, the first piezoelectric layer 410 may be provided on the entire surface of the substrate 100, may be overlapped with the first electrode 310, or may be provided on the node area N.

Referring to FIGS. 22 to 26, according to the fingerprint sensor of still another example of the second embodiment, the first electrode and the second electrode may be provided at mutually different positions.

In detail, according to the fingerprint sensor of still another example, the first electrode 310 and the second electrode 320 may be provided on the same position.

For example, the first electrode 310 and the second electrode 320 may be provided on the same surface of the substrate 100. In this case, first electrodes 310 may be connected with each other, and second electrodes 320 may be disconnected from each other.

Figure 23:
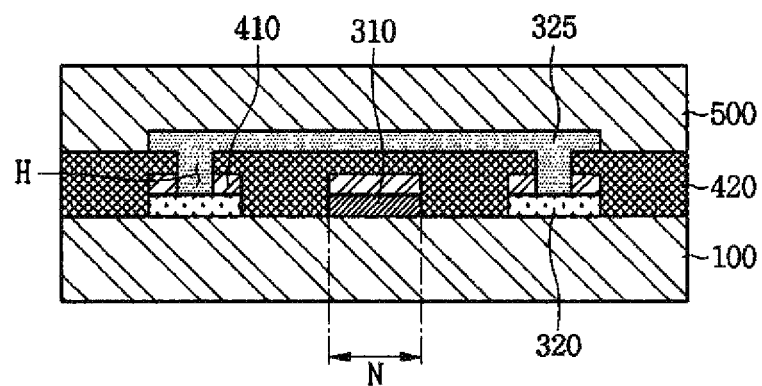
FIGS. 23 to 26 are sectional views showing various structures of the fingerprint sensor according to still another example of the second embodiment.

Referring to FIG. 23, the first electrode 310 and the second electrode 320 may be provided on one surface of the substrate 100, and the first piezoelectric layer 410 may be provided on the first electrode 310 and the second, electrode 320.

In addition, identically to those of the first embodiment, the first piezoelectric layer 410 may be provided on the entire surface of the substrate 100, overlapped with the first electrode 310, or provided on the node area N.

In addition, the second piezoelectric layer 420 may be provided on the first piezoelectric layer 410.

Identically to those of the first embodiment described above the first piezoelectric layer 410 and the second piezoelectric layer 420 may have mutually different thicknesses and/or mutually different piezoelectric materials.

The first piezoelectric layer 410 and the second piezoelectric layer 420 may be formed therein with holes H. In detail, the first piezoelectric layer 410 and the second piezoelectric layer 420 may be formed therein with holes H to expose one surface of the second electrode 320.

The connection electrode 225 is provided on the second piezoelectric layer 420. In detail, the connection electrode 225 may connect the second electrodes 320 with each other through the hole H.

In this case, the first electrode 310 and the connection electrode 325 may be provided at positions overlapped with each other. In other words, the first electrode 310 and the second electrode 320 may be provided on and under the first piezoelectric layer 410 and the second piezoelectric layer 420 by the connection electrode 325. The node area N to transmit the ultrasonic signal may be formed at the position at which the first electrode 310 is overlapped with the connection electrode 325.

Figure 24:
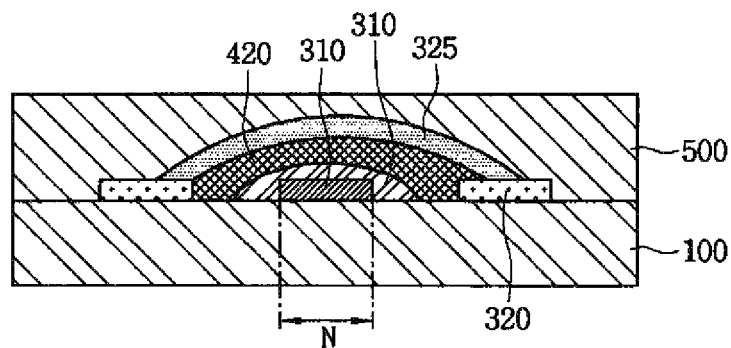

Referring to FIG. 24, the first piezoelectric layer 410 and the second piezoelectric layer 420 may be provided on the substrate 100. In detail, the first piezoelectric layer 410 and the second piezoelectric layer 420 may be provided on a portion of the substrate 100. For example, the first piezoelectric layer 410 and the second piezoelectric layer 420 may cover the first electrode 310.

In addition, the connection electrode 325 may be provided on the second piezoelectric layer 420. In detail, the connection electrode 325 may be provided on the second piezoelectric layer 420 to connect the second electrodes 320, which are adjacent to the first electrode 310 and provided on the same surface of the substrate 100, with each other.

In this case, the first electrode 310 may be overlapped with the connection electrode 325. In other words, the first and second electrodes 310 and 320 may be provided on and under the first piezoelectric layer 410 and the second piezoelectric layer 420 by the connection electrode 325. The node area N to transmit the ultrasonic signal may be formed at the position at which the first electrode 310 and the connection electrode 325 are overlapped with each other. In other words, the first piezoelectric layer 410 and the second piezoelectric layer 420 may be overlapped with the node area N on the substrate 100.

Figure 22:
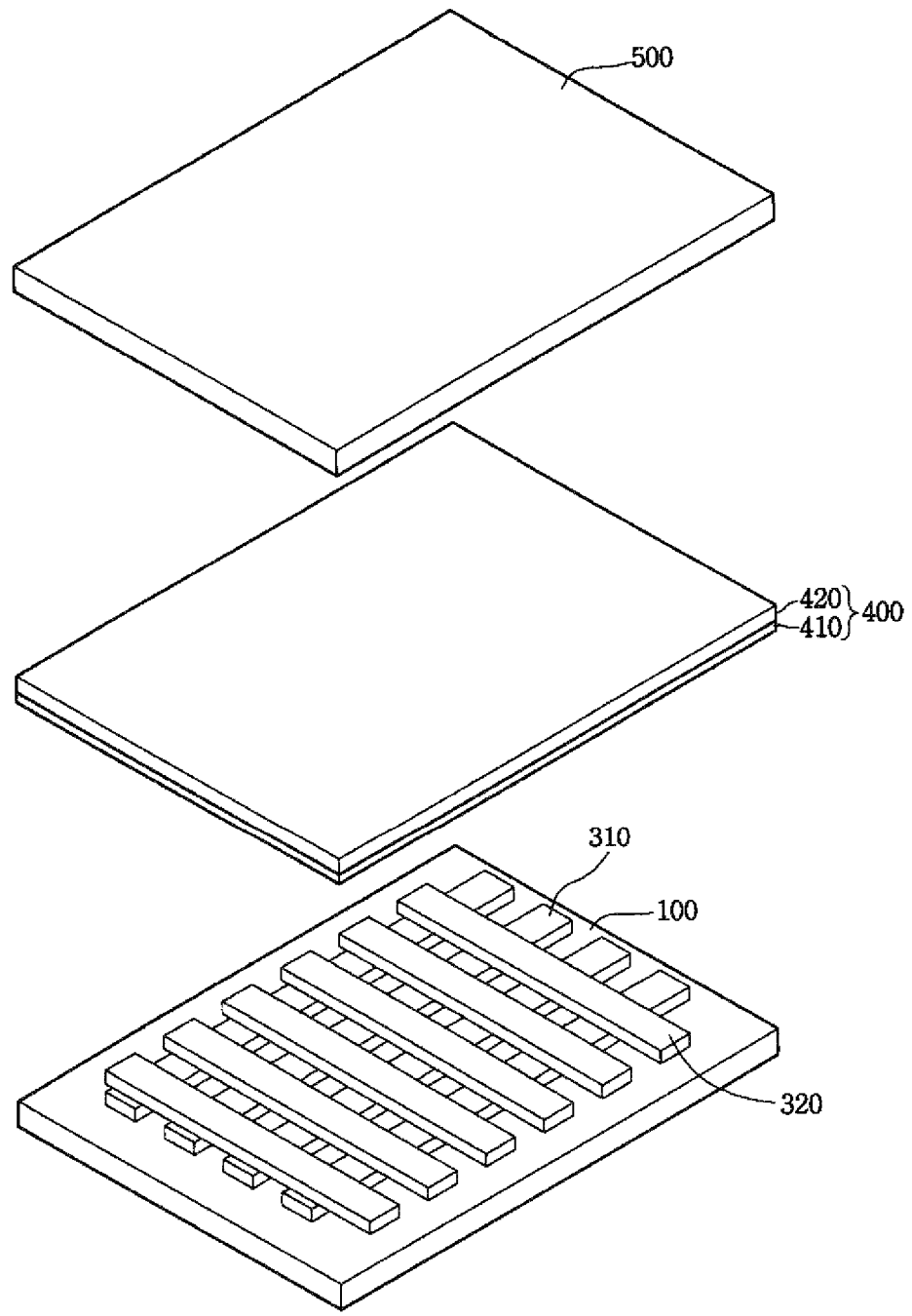
FIG. 22 is a perspective view showing the fingerprint sensor according to still another example of the second embodiment.

Although FIGS. 22 and 23 show that the piezoelectric layer is provided on the first and second electrodes, the embodiment is not limited thereto. In other words, the first and second electrodes may be provided on the piezoelectric substrate.

Figure 25:
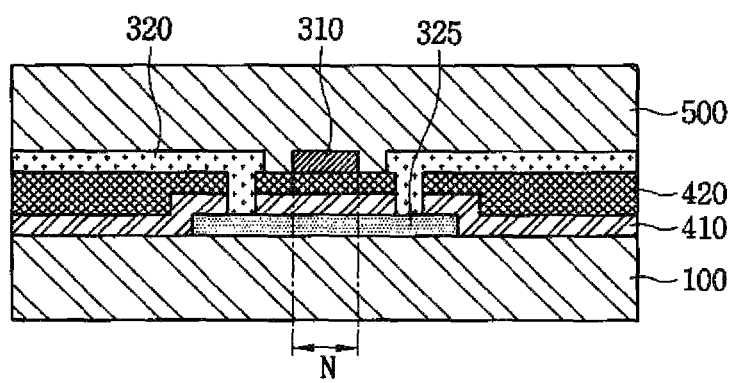

Referring to FIG. 25, the connection electrode 325 is provided on the substrate 100. The first piezoelectric layer 410 and the second piezoelectric layer 420 may be provided to surround the connection electrode 325. The first piezoelectric layer 410 and the second piezoelectric layer 420 may be formed therein with holes to expose one surface of the connection electrode 325.

The first and second electrodes 310 and 320 may be provided on the second piezoelectric layer 420. For example, the first electrode 310 may be provided on the second piezoelectric layer 420, and the second electrode 320 may be provided on the second piezoelectric layer 420 having the hole. The second electrodes 320 may be connected with the connection electrode 325, so that the second electrodes 320 may be connected with each other.

In this case, the first electrode 310 and the connection electrode 325 may be provided at positions overlapped with each other. In other words, the first electrode 310 and the second electrode 320 may be provided on and under the first piezoelectric layer 410 and the second piezoelectric layer 420 by the connection electrode 325. The node area N to transmit the ultrasonic signal may be formed at the position at which the first electrode 310 is overlapped with the connection electrode 325.

Figure 26:
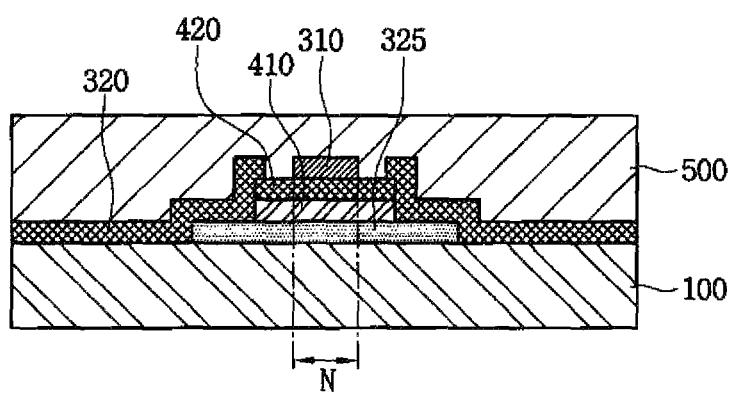

Referring to FIG. 26, the connection electrode 325 may be provided on the substrate 100, and the first piezoelectric layer 410 and the second piezoelectric layer 420 may be provided on the connection electrode 325. The first piezoelectric layer 410 and the second piezoelectric layer 420 may be provided on one area of the connection electrode 325. In other words, the first piezoelectric layer 410 and the second piezoelectric layer 420 may be partially provided on the connection electrode 325.

The first and second electrodes 310 and 320 may be provided on the second piezoelectric layer 420. For example, the first electrode 310 may be provided on the second piezoelectric layer 420, and the second electrode 320 may be provided on the second piezoelectric layer 420 while making contact with the connection electrode 325. One surface of the second electrode 320 may make contact with the first piezoelectric layer 410. Accordingly, the second electrodes 320 spaced apart from each other may be connected with each other by the connection electrode 325.

In this case, the first electrode 310 may be overlapped with the connection electrode 325. In other words, the first and second electrodes 310 and 320 may be provided on and under the first piezoelectric layer 410 and the second piezoelectric layer 420 by the connection electrode 325, and the node area N to transmit the ultrasonic signal may be formed at a position at which the first electrode 310 is overlapped with the connection electrode 325. In other words, the first piezoelectric layer 410 and the second piezoelectric layer 420 are provided on the connection electrode 325 while being overlapped with the node area N.

Figure 27:
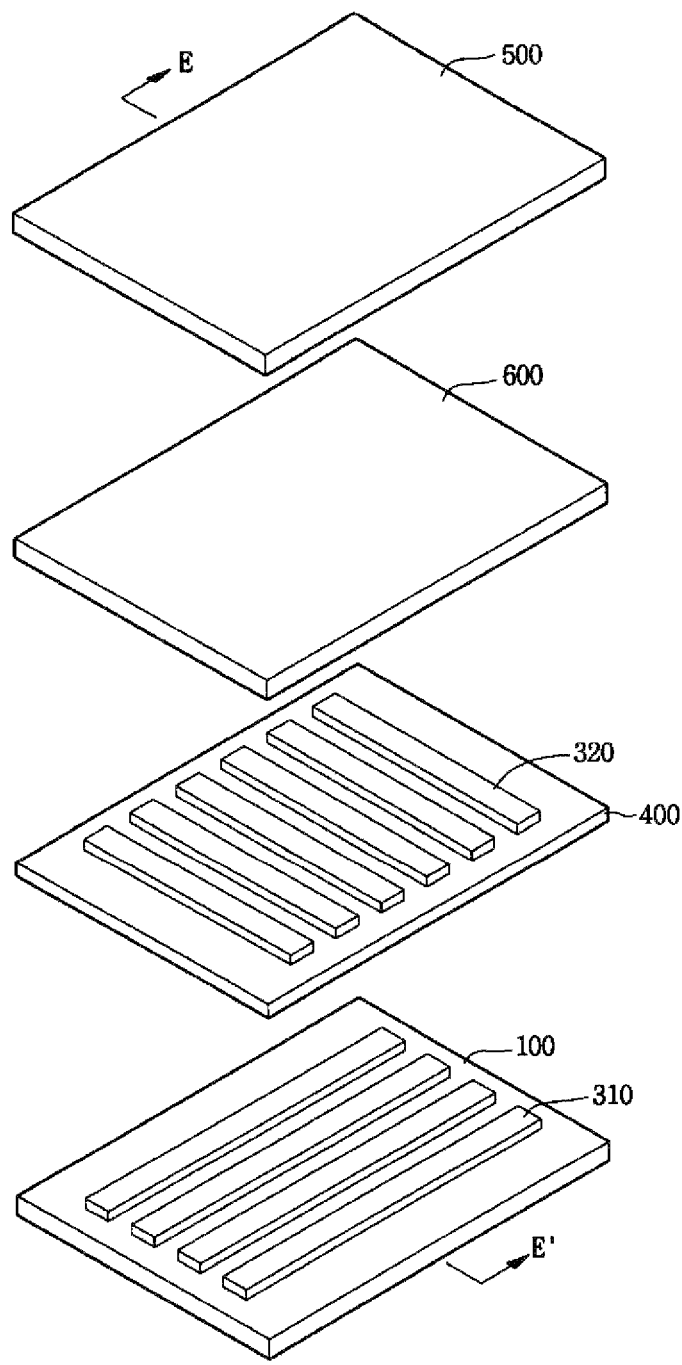
FIG. 27 is a perspective view showing the fingerprint sensor according to the third embodiment.
Figure 28:
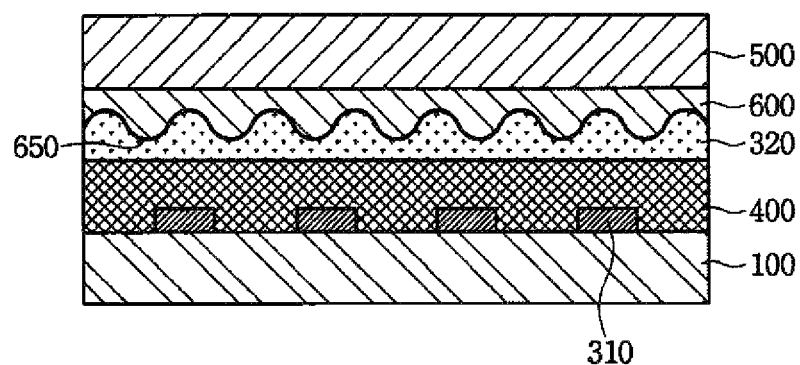
FIGS. 28 to 30 are sectional views taken along line E-E' of FIG. 27.

Referring to FIGS. 27 to 28, a fingerprint sensor according to the third embodiment may include the substrate 100, the first electrode 310, the second electrode 320, the piezoelectric layer 400, an intermediate layer 600, and the cover substrate 500.

Since the first electrode 310, the second electrode 320, and the piezoelectric layer 400 are same as or similar to those of the fingerprint sensor of the first embodiment, the details thereof will be omitted.

Figure 29:
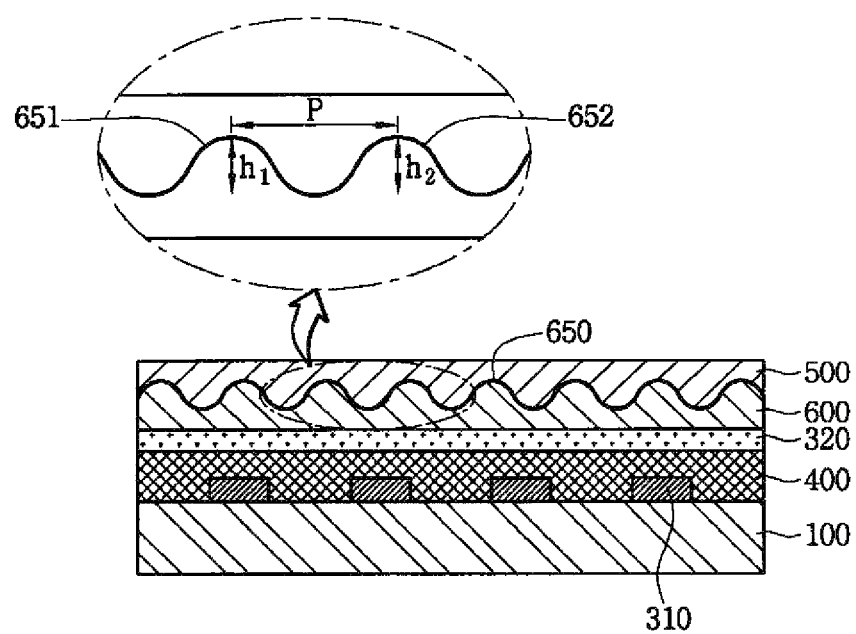
Figure 30:
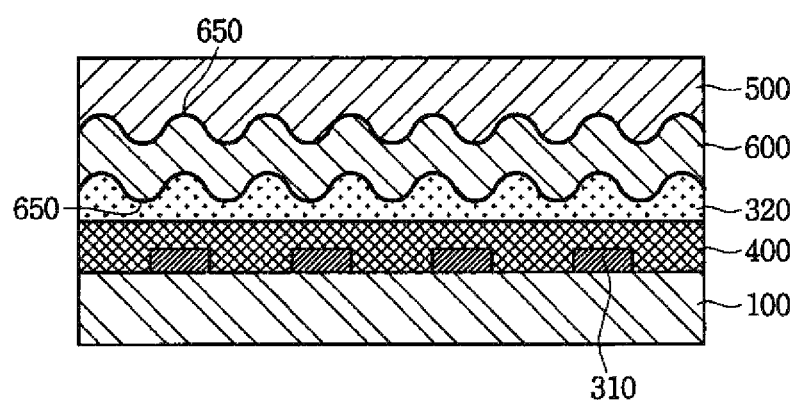

Referring to FIGS. 28 to 30, the intermediate layer 600 may be provided on the piezoelectric layer 400. A pattern may be formed on at least one surface of the intermediate layer 600.

For example, the intermediate layer 600 may have one surface and an opposite surface opposite to one surface. In detail, the intermediate layer 600 may have one surface directly or indirectly making contact with the piezoelectric layer 400, and an opposite surface directly or indirectly making contact with the cover substrate 500.

A plurality of protrusion parts may be provided on at least one of one surface and an opposite surface of the intermediate layer 600.

Referring to FIG. 28, protrusion parts 650 may be provided only on the one surface of the intermediate layer 600. In other words, the protrusion parts 650 may be provided on one surface which is a boundary surface between the intermediate layer 600 and the piezoelectric layer 400.

In addition, referring to FIG. 29, the protrusion parts 650 may be provided only on the opposite surface of the intermediate layer 600. In other words, the protrusion parts 650 may be provided on the opposite surface which is the boundary surface between the intermediate layer 600 and the cover substrate 500.

In addition, referring to FIG. 30, the protrusion parts 650 may be provided on the one surface and the opposite surface of the intermediate layer 600. In other words, the protrusion parts 650 may be provided on the one surface, which is the boundary surface between the intermediate layer 600 and the piezoelectric layer 400, and the opposite surface, which is the boundary surface between the intermediate layer 600 and the cover substrate 500.

The protrusion part 650 may include at least one of a flat surface and a curved surface. For example, the protrusion part may have a circular shape or an oval shape while having a curved surface on the whole. In addition, the protrusion part 650 may have a polygonal shape, such as rectangular shape or a triangular shape, while having a flat surface on the whole. In addition, the protrusion part 650 may have a complex shape partially having a flat surface and partially having a curved surface.

The protrusion parts 650 may include a first sub-protrusion part 651 and a second sub-protrusion part 652 spaced apart from each other. The first sub-protrusion part 651 and the second sub-protrusion part 652 may have the same shape or a similar shape. In addition, the first sub-protrusion part 651 and the second sub-protrusion 652 may have mutually different shapes.

The first sub-protrusion part 651 and the second sub-protrusion part 652 may have heights equal to each other, similar to each other, or different from each other. For example, a height h1 of the first sub-protrusion part 651 and a height h2 of the second sub-protrusion part 652 may be equal to each other, similar to each other, or different from each other in the range of about 50 nm to about 200 nm.

If the height h1 of the first sub-protrusion part 651 and the height, h2 of the second sub-protrusion part 652 may be less than about 50 nm or exceed about 200 nm, the grating effect according to the protrusion parts may be reduced.

In addition, the first sub-protrusion part 651 and the second sub protrusion part 652 may be spaced apart from each other at a predetermined interval or pitch. For example, the interval or the pitch between the first sub-protrusion part 651 and the second sub-protrusion part 652 may be smaller than the wavelength of the acoustic impedance of the transmitted or received ultrasonic signal. In detail, the pitch between the first sub-protrusion part 651 and the second sub-protrusion part 652 may be in the range of about 50 nm to about 200 nm.

If the pitch between the first sub-protrusion part 651 and the second sub-protrusion part 652 is less than about 50 nm or exceeds about 200 nm, the grating effect according to the protrusion parts may be reduced.

The intermediate layer 600 and the protrusion part 650 may include a transparent material or a semi-transparent material. Preferably, the intermediate layer 600 and the protrusion part 650 may include a transparent material.

In addition, the intermediate layer 600 and the protrusion part 650 may include resin. For example, the intermediate layer 600 and the protrusion part 650 may include a resin material, such as an optically clear adhesive (OCA), a liquid-optically clear adhesive (LOCA), or an optically clear resin (OCR).

The piezoelectric layer 400, the intermediate layer 600, and the cover substrate 500 may have mutually different acoustic impedances. For example, the acoustic impedances of the piezoelectric layer 400, the intermediate layer 600, and the cover substrate 500 may satisfy Equation 1.

$$\text{Acoustic impedance of piezoelectric layer} < \text{acoustic impedance of immediate layer} < \text{acoustic impedance of cover substrate} \quad [\text{Equation 1}]$$

When the acoustic impedances of the piezoelectric layer 400, the intermediate layer 600, and the cover substrate 500 are out of the range of Equation 1, the ultrasonic signal, which is transmitted or received in a direction from the piezoelectric layer 400 to the cover substrate 500 or a direction from the cover substrate 500 to the piezoelectric layer 400 is not smoothly moved, the efficiency of the fingerprint sensor may be lowered.

The cover substrate 500 may be provided on the intermediate layer 600. The cover substrate 500 may include a material the same as or similar to a material constituting the substrate 100.

The fingerprint sensor according to the third embodiment may include an intermediate layer including a plurality of protrusion parts. Accordingly, the ultrasonic signal transmitted in the direction from the piezoelectric layer to the cover substrate or received in the direction from the cover substrate to the piezoelectric layer can be smoothly moved.

The acoustic impedance may be defined with a density and the speed of the ultrasonic wave in a material. In other words, the intermediate layer interposed between the piezoelectric layer and the cover substrate reduces the difference between the acoustic impedances of the piezoelectric layer and the cover substrate, so that the ultrasonic signal transmitted in the direction from the piezoelectric layer to the cover substrate or received in the direction from the cover substrate to the piezoelectric layer can be smoothly moved.

In addition, a protrusion pattern is formed on at least one of one surface and an opposite surface of the intermediate layer, so that the acoustic impedance may be gradually changed due to the protrusion part when the ultrasonic signal having the wavelength longer than that of the protrusion pattern passes through the intermediate layer.

Accordingly, even if the intermediate layer has a single layer structure, as the intermediate layer changes the acoustic impedances of the piezoelectric layer and the cover substrate stepwise, the transmitted or received ultrasonic signal is smoothly moved. Accordingly, the fingerprint sensor is realized with a thin thickness, and, the efficiency of the fingerprint sensor can be improved.

Hereinafter, the fingerprint sensor according to another example of the third embodiment will be described with reference to FIGS. 31 to 37. In the following description of the fingerprint sensor according to another example of the second embodiment, the description the same as or similar to the above description of the fingerprint sensor according to the third embodiment will be omitted, and the same reference numerals will be assigned to the same elements.

Figure 31:
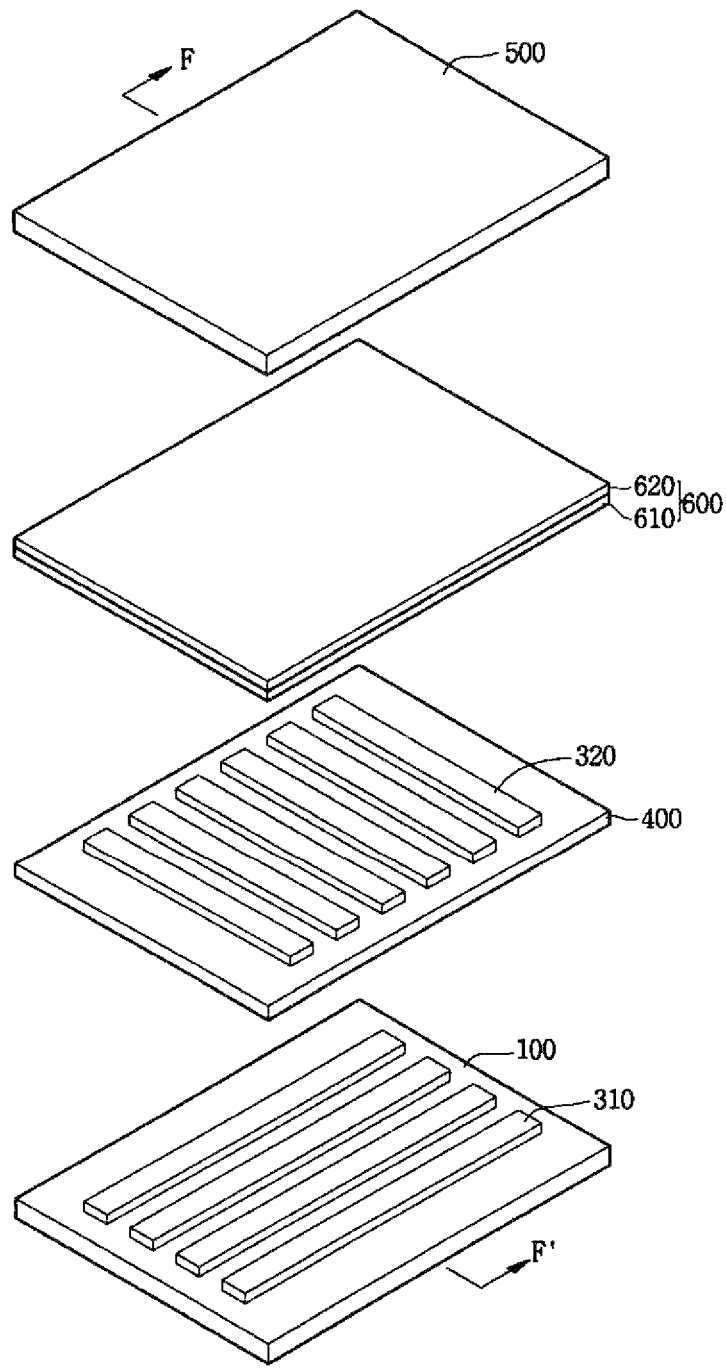
FIG. 31 is a perspective view showing the fingerprint sensor according to another example of the third embodiment.

Referring to FIG. 31, the fingerprint sensor according to another example of the third embodiment may include a first intermediate layer 610 and a second intermediate layer 620. In detail, the fingerprint sensor according to another example of the third embodiment may include the first intermediate layer 610 provided on the second electrode 320 and a second intermediate layer 620 provided on the first intermediate layer 610.

In addition, at least one of the first intermediate layer 610 and the second intermediate layer 620 may include a plurality of protrusion parts.

Figure 32:
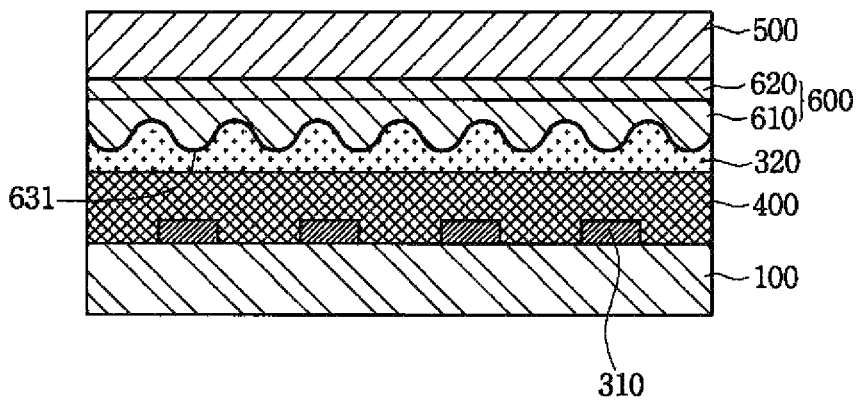
FIGS. 32 to 37 are sectional views taken along line F-F' of FIG. 7.

Referring to FIG. 32, the first intermediate layer 610 may include a plurality of first protrusion parts 631. For example, the first intermediate layer 610 may include the first protrusion parts 631 provided on one surface of the first intermediate layer 600 facing the piezoelectric layer 400.

Figure 33:
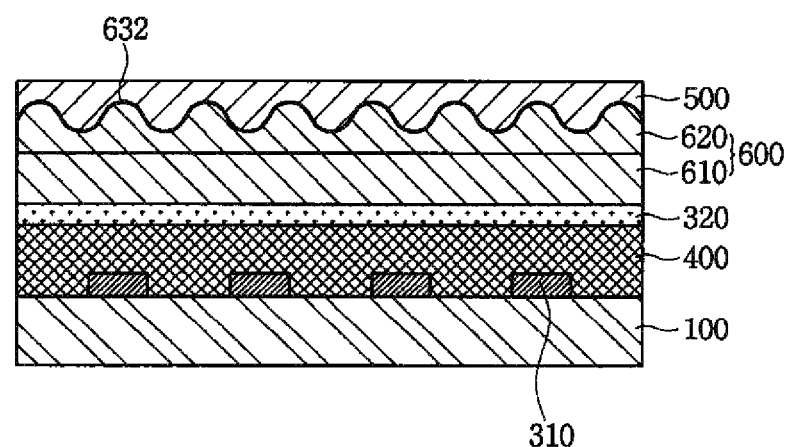

In addition, referring to FIG. 33, the second intermediate layer 620 may include a plurality of second protrusion parts 632. For example, the second intermediate layer 620 may include the second protrusion parts 632 provided on one surface of the second intermediate layer 620 facing the cover substrate 500.

Figure 34:
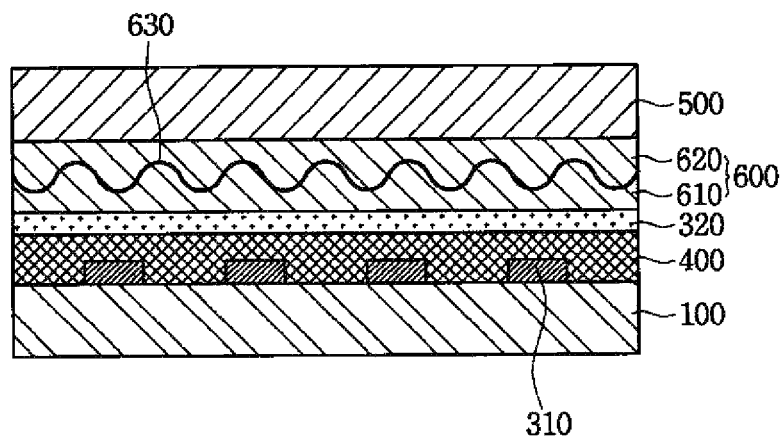

In addition, referring to FIG. 34, the first intermediate layer 610 or the second intermediate layer 620 may include a plurality of protrusion parts 630. For example, a plurality of protrusion parts 630 may be provided on an opposite surface to one surface of the first intermediate layer 610 and on an opposite surface to one surface of the second intermediate layer 620.

Figure 35:
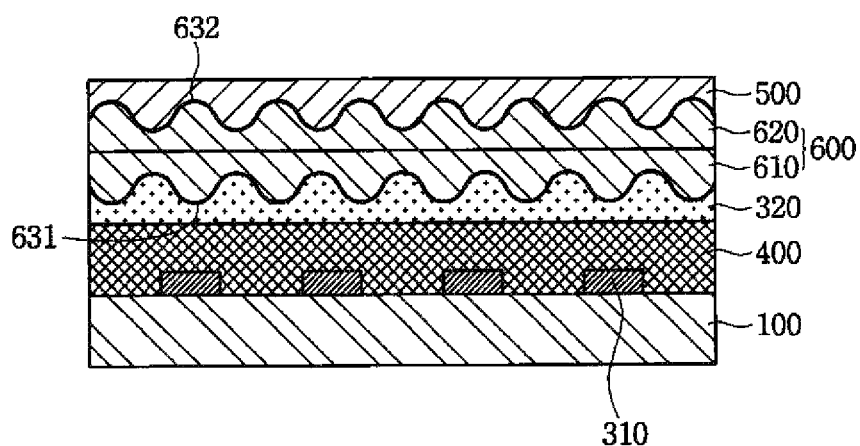
Figure 36:
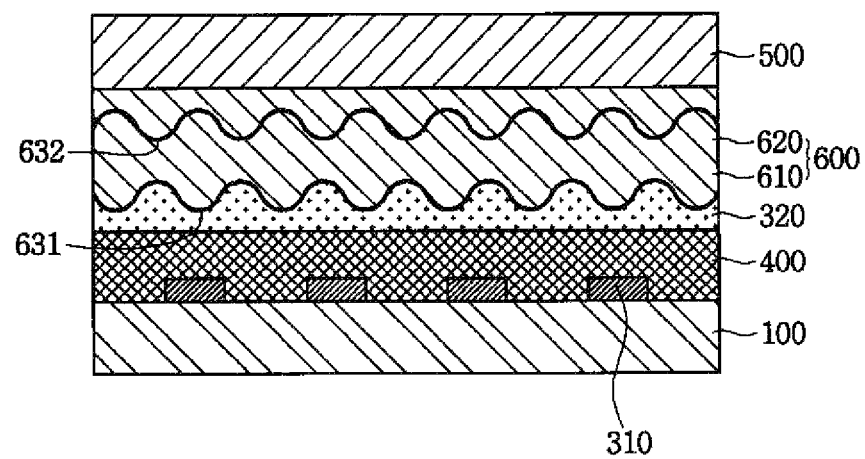
Figure 37:
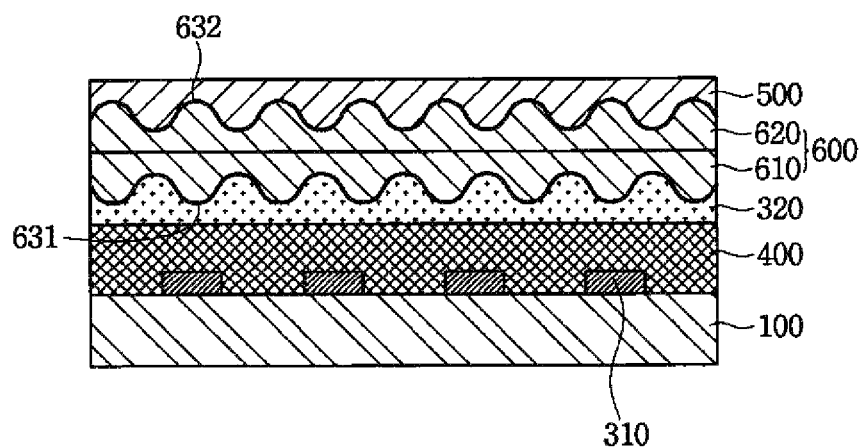
Figure 38:
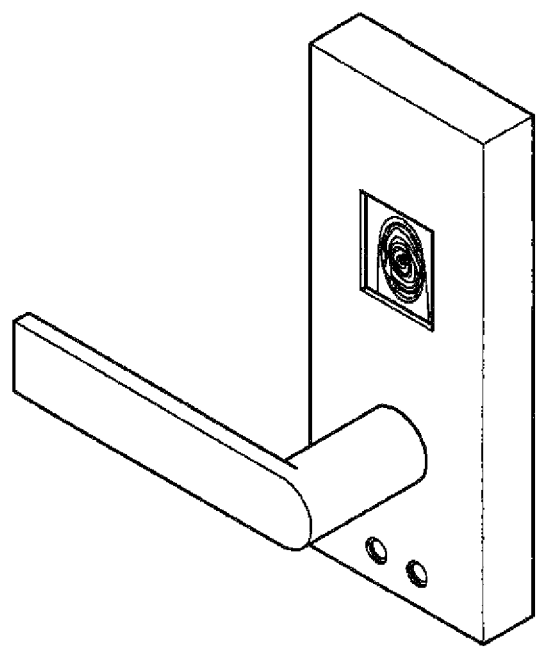
FIGS. 38 to 41 are views showing various devices employing the fingerprint sensor according to the embodiments.
Figure 39:
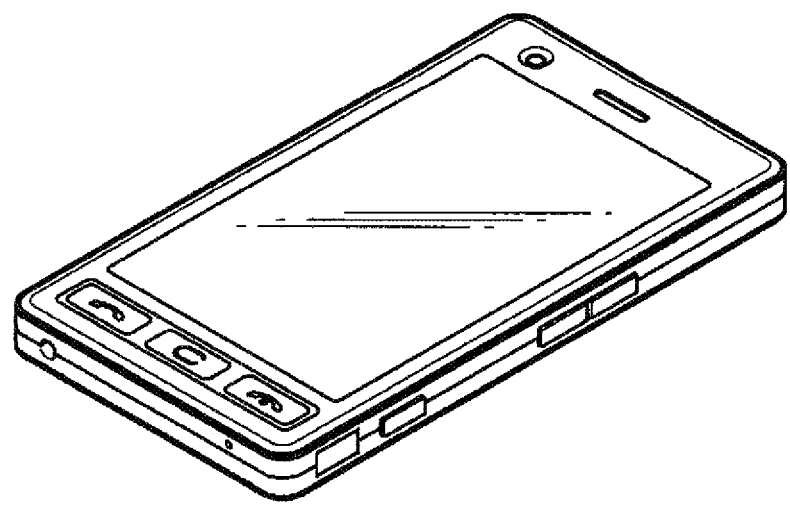
Figure 40:
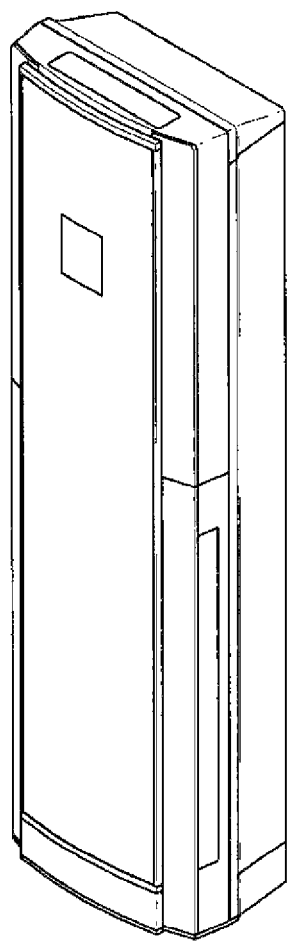
Figure 41:

In addition, referring to FIGS. 35 to 37, protrusion parts may be provided on the first intermediate layer 610 and the second intermediate layer 620, respectively.

For example, referring to FIG. 35, the first protrusion parts 631 may be provided on one surface of the first intermediate layer 610, and the second protrusion parts 632 may be provided on, one surface of the second intermediate layer 620.

In addition, referring to FIG. 36, the first protrusion parts 631 may be provided on one surface of the first intermediate layer 610, and the second protrusion parts 632 may be provided on an opposite surface of the second intermediate layer 620.

In addition, referring to FIG. 36, the first protrusion parts 631 may be provided on an opposite surface of the first intermediate layer 610, and the second protrusion parts 632 may be provided on one surface of the second intermediate layer 620.

The first protrusion part 631 and the second protrusion parts 632 may be overlapped with each other. Alternately, the first protrusion part 631 and the second protrusion part 632 may not be overlapped with each other. In other words, the first and second protrusion parts 631 and 632 may be alternately provided, that is, offset from each other.

The acoustic impedances of the first intermediate layer 610 and the second intermediate layer 620 may satisfy following equation 2.

$$\text{The acoustic impedance of the second intermediate layer} < \text{the acoustic impedance of the first intermediate layer.} \quad [\text{Equation 2}]$$

When the acoustic impedances of the first intermediate layer 610 and the second intermediate layer 620 are out of the range of Equation 2, the ultrasonic signal transmitted or received in the direction from the piezoelectric layer 400 to the cover substrate 500 or the direction from the cover substrate 500 to the piezoelectric layer 400 is not smoothly moved, so that the efficiency of the fingerprint sensor may be degraded.

In addition, the acoustic impedances of the cover substrate 500, the first intermediate layer 610, the second intermediate layer 620, and the piezoelectric layer 400 may satisfy following Equation 3.

The acoustic impedance of the piezoelectric layer<the acoustic impedance of the second intermediate layer<the acoustic impedance of the first intermediate layer<the acoustic impedance of the cover substrate. [Equation 3]

When the acoustic impedances of the cover substrate 500, the first intermediate layer 610, the second intermediate layer 620, and the piezoelectric layer 400 are out of the range of Equation 3, the ultrasonic signal transmitted or received in the direction from the piezoelectric layer 400 to the cover substrate 500 or the direction from the cover substrate 500 to the piezoelectric layer 400 is not smoothly moved, so that the efficiency of the fingerprint sensor may be degraded.

In addition, at least one protrusion part among the first protrusion parts 631 and the second protrusion parts 632 may have the height of about 50 nm to about 200 nm.

Further, the first protrusion parts 631 may be spaced apart from each other at a first interval, and the second protrusion parts 632 may be spaced apart from each other at a second interval. In this case, at least one of the first interval and the second interval may be in the range of about 50 nm to about 200 nm.

The fingerprint sensor according to the third embodiment may include a plurality of intermediate layers including a plurality of protrusion parts. Accordingly, the ultrasonic signal transmitted in the direction from the piezoelectric layer to the cover substrate or received in the direction from the cover substrate to the piezoelectric layer can be smoothly moved.

In detail, multiple intermediate layers are formed to reduce the difference between the acoustic impedances, multiple protrusion parts are provided on at least one intermediate layer to reduce the acoustic impedance stepwise, so that the ultrasonic signal transmitted in the direction from the piezoelectric layer to the cover substrate or received in the direction from the cover substrate to the piezoelectric layer can be smoothly moved.

Therefore, as the intermediate layer changes the acoustic impedances of the piezoelectric layer and the cover substrate stepwise, the transmitted or received ultrasonic signal is smoothly moved, so that the fingerprint sensor is realized with a thin thickness, and the efficiency of the fingerprint sensor can be improved.

What is claimed is:

1. A fingerprint sensor comprising:
a substrate;
a first electrode on the substrate;
a first piezoelectric layer on the first electrode;
a second piezoelectric layer on the first piezoelectric layer; and
a second electrode on the second piezoelectric layer.

2. The fingerprint sensor of claim 1, wherein the first piezoelectric layer is provided on an entire surface of the first electrode.

3. The fingerprint sensor of claim 1, wherein the first piezoelectric layer has a thickness thinner than a thickness of the second piezoelectric layer.

4. The fingerprint sensor of claim 3, wherein the first piezoelectric layer has the thickness in a range of 0.1 µm to 1 µm.

5. The fingerprint sensor of claim 1, wherein the first piezoelectric layer includes a piezoelectric material different from a piezoelectric material constituting the second piezoelectric layer.

6. The fingerprint sensor of claim 5, wherein the first piezoelectric layer includes PZT, and the second piezoelectric layer includes PVDF.

7. A fingerprint sensor comprising:
a substrate;
a first electrode on the substrate;
a piezoelectric layer on the first electrode;
a second electrode on the piezoelectric layer;
an intermediate layer on the second electrode; and
a cover substrate on the intermediate layer,
wherein the intermediate layer comprises a plurality of protrusion parts provided on at least one of one surface and an opposite surface of the intermediate layer.

8. The fingerprint sensor of claim 5, wherein each protrusion part comprises a first sub-protrusion part and a second sub-protrusion part spaced apart from each other, and the first and second sub-protrusion parts have heights in a range of 50 nm to 200 nm.

9. The fingerprint sensor of claim 6, wherein an interval between the first sub-protrusion part and the second sub-protrusion part is in a range of 50 nm to 200 nm.

10. The fingerprint sensor of claim 5, wherein the cover substrate, the intermediate layer, and the piezoelectric layer have acoustic impedances satisfying Equation 1, the acoustic impedance of the piezoelectric layer<the acoustic impedance of the intermediate layer<the acoustic impedance of the cover substrate. Equation 1

11. The fingerprint sensor of claim 7,
wherein the intermediate layer comprises:
a first intermediate layer on the second electrode; and
a second intermediate layer on the first intermediate layer, and
wherein at least one of the first and second intermediate layers comprises the protrusion parts.

12. The fingerprint sensor of claim 11, wherein the first intermediate layer comprises a plurality of first protrusion parts provided on at least one of one surface and an opposite surface of the first intermediate layer, and
the second intermediate layer comprises a plurality of second protrusion parts provided on at least one of one surface, and an opposite surface of the second intermediate layer.

13. The fingerprint sensor of claim 1, wherein the first piezoelectric layer is provided only on the first electrode.

14. The fingerprint sensor of claim 1, wherein:
the first electrode and the second electrode cross each other to form a node area, and extend in mutually different directions, and
the first piezoelectric layer is provided on the node area, and the first piezoelectric layer is provided on an area of the first electrode corresponding to the node area.

15. The fingerprint sensor of claim 1, wherein the substrate includes a cover substrate.

16. The fingerprint sensor of claim 1, wherein:
the first electrode and the second electrode cross each other to form a node area, and extend in mutually different directions, and
the node area comprises a first node area and a second node area adjacent to each other, and an interval between the first and second node, areas is 50 µm or less.

17. The fingerprint sensor of claim 1, wherein the substrate has a partial flat surface and a partial curved surface.

18. The fingerprint sensor of claim 5, wherein the first and second piezoelectric layers include at least one of α-AlPO$_4$, α-SiO$_2$, LiTiO$_3$, LiNbO$_3$, SrxBayNb$_2$O$_3$, Pb$_5$—Ge$_3$O$_{11}$, Tb2(MnO4)3, Li$_2$B$_4$O$_7$, CdS, ZnO, BiI$_2$SiO$_{20}$ or BiI$_2$GeO$_{20}$, PVDF, P(VDF-TrFe), P(VDFTeFE), TGS, ZnO, CdS, AlN, PZT-PVDF, PZT-Silicon Rubber, PZT-Epoxy, PZT-foamed polymer, or PZT-foamed urethane.

19. The fingerprint sensor of claim 1, wherein the first and second electrodes include at least one of indium tin oxide (ITO), indium zinc oxide (IZO), copper oxide, tin oxide, zinc oxide, titanium oxide, a nanowire, a photo-sensitive nanowire film, a carbon nanotube (CNT), graphene, conductive polymer, Cr, Ni, Cu, Al, Ag, Mo, Au, or Ti.

20. The fingerprint sensor of claim 1, wherein at least one of the first and second electrodes is formed in a mesh shape.

21. The fingerprint sensor of claim 16, wherein the node area has the resolution of 400 dpi to 500 dpi.

22. The fingerprint sensor of claim 1, wherein the first and second piezoelectric layer have a haze value in a range of 1% to 2%.

23. The fingerprint sensor of claim 1, wherein the first electrode makes contact with the top surface and the lateral side of the first electrode.

24. The fingerprint sensor of claim 1, wherein at least one of the first and second piezoelectric layers include a transparent piezoelectric film, a semi-transparent piezoelectric film, or an opaque piezoelectric film.

\* \* \* \* \*